United States Patent
Kimura et al.

(10) Patent No.: US 10,707,310 B2
(45) Date of Patent: *Jul. 7, 2020

(54) SEMICONDUCTOR DEVICE

(71) Applicant: KABUSHIKI KAISHA TOSHIBA, Minato-ku (JP)

(72) Inventors: Shigeya Kimura, Yokohama (JP); Hisashi Yoshida, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/286,649

(22) Filed: Feb. 27, 2019

(65) Prior Publication Data

US 2019/0348503 A1 Nov. 14, 2019

(30) Foreign Application Priority Data

May 14, 2018 (JP) ................................. 2018-093030

(51) Int. Cl.
*H01L 31/0256* (2006.01)
*H01L 29/20* (2006.01)
(Continued)

(52) U.S. Cl.
CPC ...... *H01L 29/2003* (2013.01); *H01L 29/1608* (2013.01); *H01L 29/66462* (2013.01); *H01L 29/7786* (2013.01); *H01L 29/7842* (2013.01)

(58) Field of Classification Search
CPC ............. H01L 29/7783; H01L 29/1608; H01L 29/2003; H01L 29/267
(Continued)

(56) References Cited

U.S. PATENT DOCUMENTS

2017/0200806 A1* 7/2017 Ichimura ........... H01L 21/02378
2019/0032856 A1* 1/2019 Lim ........................ F21V 29/70
(Continued)

FOREIGN PATENT DOCUMENTS

JP 5207874 B2 6/2013

OTHER PUBLICATIONS

Zhanwei Shen, et al., "Prediction of High-Density and High-Mobility Two-Dimensional Electron Gas at $Al_xGa_{1-x}N/4H$-SiC Interface", Material Science Forum, vol. 897, 2017, 1 page.
(Continued)

*Primary Examiner* — David S Blum
(74) *Attorney, Agent, or Firm* — Oblon, McClelland, Maier & Neustadt, L.L.P.

(57) ABSTRACT

According to one embodiment, a semiconductor device includes first to third regions, and first to third electrodes. The first region includes a first partial region, a second partial region, and a third partial region between the first and second partial regions. A direction from the first partial region toward the first electrode is aligned with a first direction. A second direction from the first electrode toward the second electrode crosses the first direction. A direction from the third partial region toward the third electrode is aligned with the first direction. A position of the third electrode is between a position of the first electrode and a position of the second electrode in the second direction. At least a portion of the second region is provided between the first and second electrodes. At least a portion of the third region is provided between the first and second regions.

20 Claims, 15 Drawing Sheets

(51) Int. Cl.
  *H01L 29/16* (2006.01)
  *H01L 29/778* (2006.01)
  *H01L 29/66* (2006.01)
  *H01L 29/78* (2006.01)

(58) Field of Classification Search
  USPC .......................................................... 257/76
  See application file for complete search history.

(56) References Cited

U.S. PATENT DOCUMENTS

2019/0348503 A1* 11/2019 Kimura ............. H01L 29/66462
2019/0385846 A1* 12/2019 Fukuhara .............. H01L 29/812
2020/0027978 A1* 1/2020 Kajiwara .............. H01L 29/205

OTHER PUBLICATIONS

N. Onojima, et al., "Molecular-beam epitaxy of AlN on off-oriented SiC and demonstration of MISFET using AlN/SiC interface", Phys. Stat. Sol., (c) 2, No. 7, 2005, 4 pages.

* cited by examiner

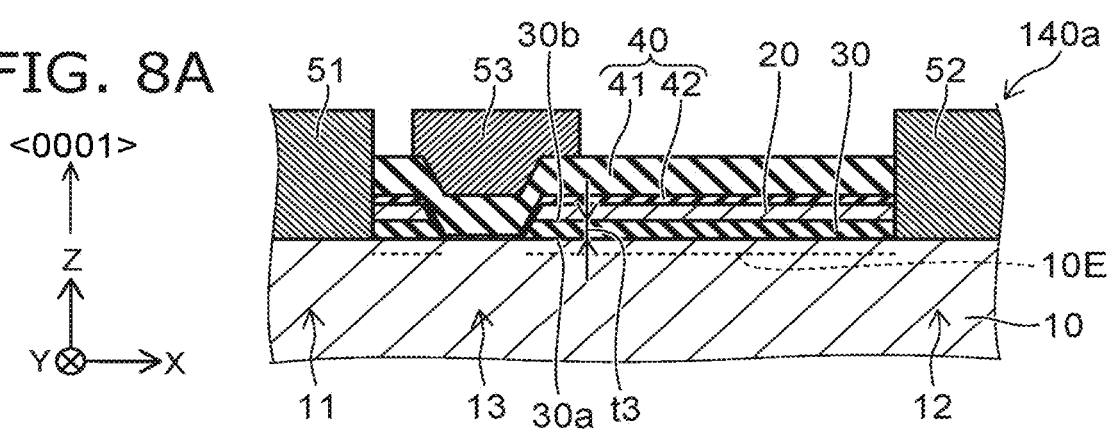
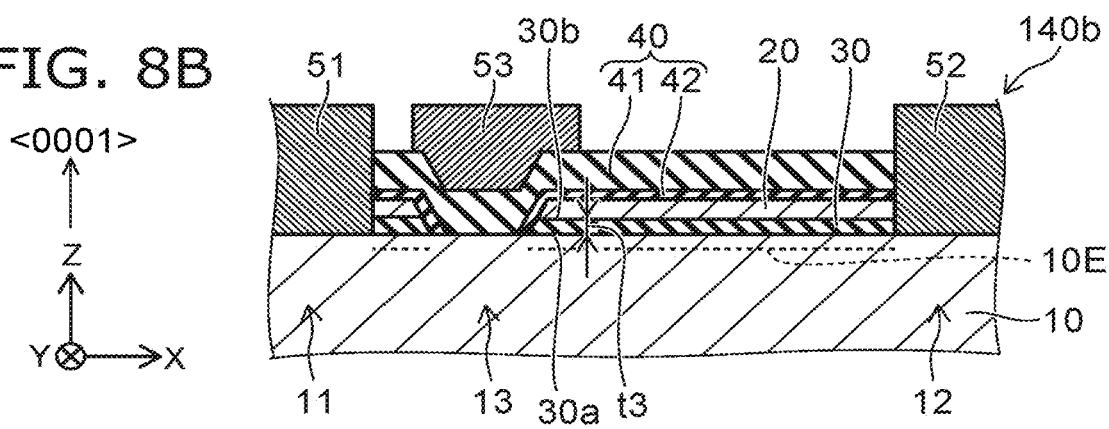
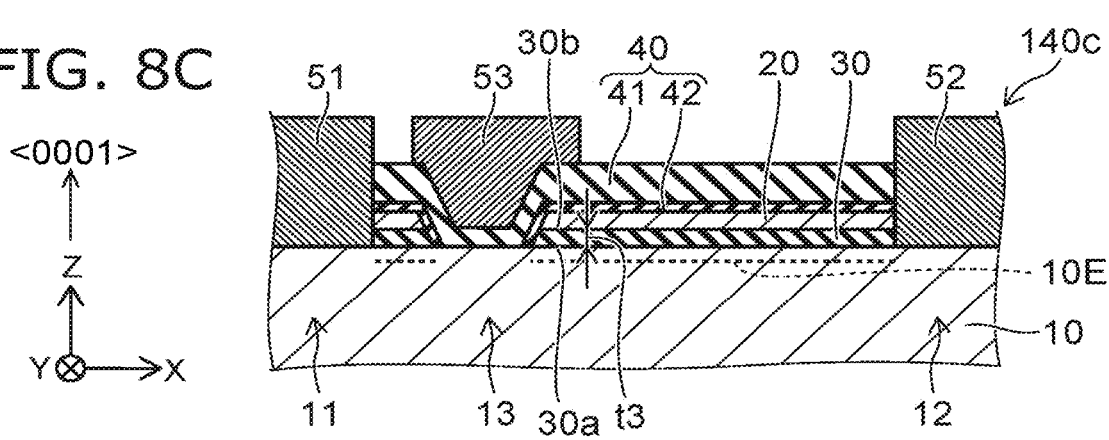
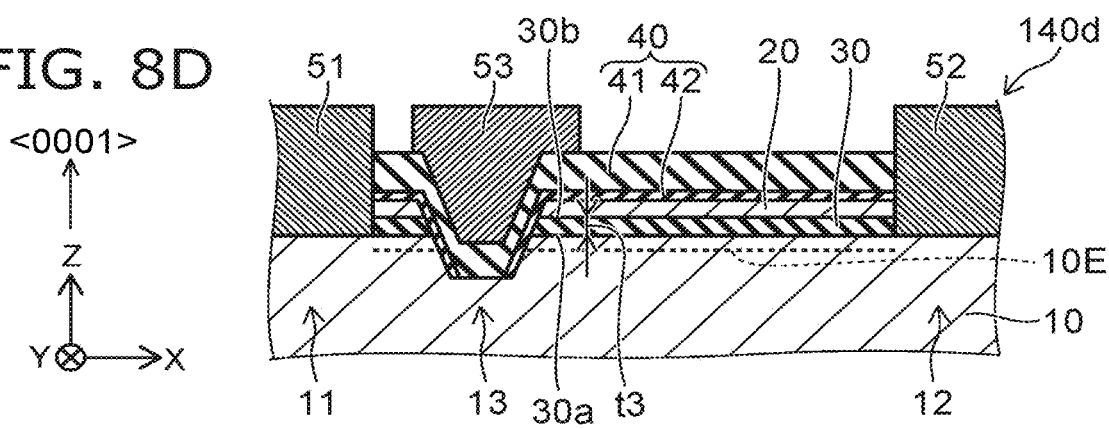

SEMICONDUCTOR DEVICE

CROSS-REFERENCE TO RELATED APPLICATIONS

This application is based upon and claims the benefit of priority from Japanese Patent Application No. 2018-093030, filed on May 14, 2018; the entire contents of which are incorporated herein by reference.

FIELD

Embodiments described herein relate generally to a semiconductor device.

BACKGROUND

For example, there is a semiconductor device such as a HEMT or the like including a GaN layer and an AlGaN layer. It is desirable to improve the characteristics of the semiconductor device.

BRIEF DESCRIPTION OF THE DRAWINGS

FIG. 8A to FIG. 8D are schematic cross-sectional views illustrating semiconductor devices according to a third embodiment;

DETAILED DESCRIPTION

Figure 1:
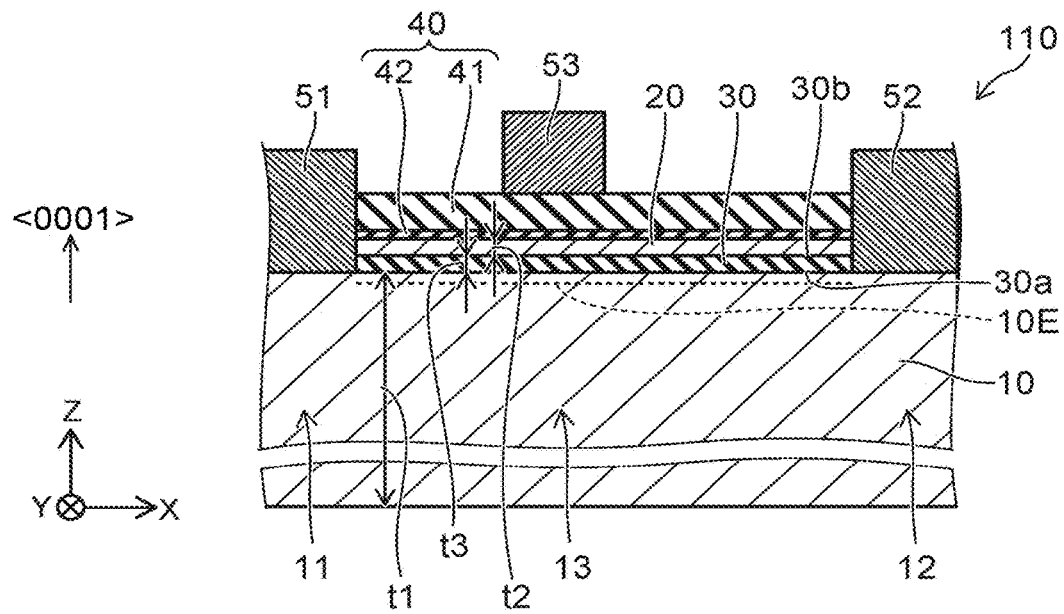
FIG. 1 is a schematic cross-sectional view illustrating a semiconductor device according to a first embodiment.

According to one embodiment, a semiconductor device includes first to third regions, and first to third electrodes. The first region includes a first material including at least one selected from the group consisting of silicon carbide, silicon, carbon, and germanium. The first region includes a first partial region, a second partial region, and a third partial region between the first partial region and the second partial region. A direction from the first partial region toward the first electrode is aligned with a first direction. A direction from the second partial region toward the second electrode is aligned with the first direction. A second direction from the first electrode toward the second electrode crosses the first direction. A direction from the third partial region toward the third electrode is aligned with the first direction. A position of the third electrode in the second direction is between a position of the first electrode in the second direction and a position of the second electrode in the second direction. The second region includes $Al_{x2}Ga_{1-x2}N$ ($0<x2\le1$). At least a portion of the second region is provided between the first electrode and the second electrode in the second direction. The third region includes a dielectric. At least a portion of the third region is provided between the first region and the second region.

According to another embodiment, a semiconductor device includes first to third regions, and first to third electrodes. The first region includes a first material including at least one selected from the group consisting of silicon carbide, silicon, carbon, and germanium. The first region includes a first partial region, a second partial region, and a third partial region between the first partial region and the second partial region. A direction from the first partial region toward the first electrode is aligned with a first direction. A direction from the second partial region toward the second electrode is aligned with the first direction. A second direction from the first electrode toward the second electrode crosses the first direction. A direction from the third partial region toward the third electrode is aligned with the first direction. A position of the third electrode in the second direction is between a position of the first electrode in the second direction and a position of the second electrode in the second direction. The second region includes $Al_{x2}Ga_{1-x2}N$ ($0<x2\le1$). At least a portion of the second region is provided between the first electrode and the second electrode in the second direction. The third region includes at least one selected from the group consisting of silicon oxide, silicon oxynitride, silicon nitride, aluminum oxide, aluminum oxynitride, aluminum nitride, boron nitride, and hafnium oxide. At least a portion of the third region is provided between the first region and the second region.

According to another embodiment, a semiconductor device includes first and second regions, and first to third electrodes. The first region includes a first material including at least one selected from the group consisting of silicon carbide, silicon, carbon, and germanium. The first region includes a first partial region, a second partial region, and a third partial region between the first partial region and the second partial region. A direction from the first partial region toward the first electrode is aligned with a first direction. A direction from the second partial region toward the second electrode is aligned with the first direction. A second direction from the first electrode toward the second electrode crosses the first direction. A direction from the third partial region toward the third electrode is aligned with the first direction. A position of the third electrode in the second direction is between a position of the first electrode in the second direction and a position of the second electrode in the second direction. The second region including $Al_{x2}Ga_{1-x2}N$ (0<x2≤1). At least a portion of the second region is provided between the first electrode and the second electrode in the second direction. The first material has a first lattice constant in an axis direction crossing the first direction when unstrained. The $Al_{x2}Ga_{1-x2}N$ (0<x2≤1) has a second lattice constant in the axis direction when unstrained. The second region has a second lattice length in the axis direction. A ratio of an absolute value of a difference between the first lattice constant and the second lattice length to an absolute value of a difference between the first lattice constant and the second lattice constant is 0.15 or more.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the first embodiment includes a first region 10, a second region 20, a third region 30, and first to third electrodes 51 to 53. An insulating portion 40 is further provided in the example.

The first region 10 includes a first material. The first material includes at least one selected from the group consisting of silicon carbide, silicon, carbon, and germanium. In the case where the first material includes SiC, the SiC includes, for example, at least one selected from the group consisting of 6H—SiC and 4H—SiC. For example, the first region 10 includes a crystal. The first region 10 may include, for example, diamond.

The first region 10 includes first to third partial regions 11 to 13. The third partial region 13 is between the first partial region 11 and the second partial region 12.

The direction from the first partial region 11 toward the first electrode 51 is aligned with a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the second partial region 12 toward the second electrode 52 is aligned with the first direction (the Z-axis direction). A second direction from the first electrode 51 toward the second electrode 52 crosses the first direction. The second direction is, for example, the X-axis direction.

The direction from the third partial region 13 toward the third electrode 53 is aligned with the first direction (the Z-axis direction). The position of the third electrode 53 in the second direction (in the example, the X-axis direction) is between the position of the first electrode 51 in the second direction and the position of the second electrode 52 in the second direction.

The second region 20 includes $Al_{x2}Ga_{1-x2}N$ (0<x2≤1). The second region 20 includes, for example, AlN. At least a portion of the second region 20 is provided between the first electrode 51 and the second electrode 52 in the second direction (e.g., the X-axis direction). In the example, at least a portion of the second region 20 is provided between the first region 10 and at least a portion of the third electrode 53 in the first direction (the Z-axis direction). For example, the second region 20 includes a crystal.

The third region 30 includes a dielectric. The third region 30 includes, for example, at least one selected from the group consisting of silicon oxide, silicon oxynitride, silicon nitride, aluminum oxide, aluminum oxynitride, aluminum nitride, boron nitride, and hafnium oxide.

For example, at least a portion of the third region 30 may be amorphous. For example, at least a portion of the third region 30 may include a polycrystal. For example, the crystallinity of at least a portion of the third region 30 may be lower than the crystallinity of the first region 10. For example, the crystallinity of at least a portion of the third region 30 may be lower than the crystallinity of the second region 20.

At least a portion of the third region 30 is provided between the first electrode 51 and the second electrode 52 in the second direction (e.g., the X-axis direction). At least a portion of the third region 30 is provided between the second region 20 and the first region 10 in the first direction (the Z-axis direction). In the example, at least a portion of the third region 30 is provided between the third electrode 53 and the first region 10 in the first direction (the Z-axis direction).

In the example, the third region 30 contacts the first region 10. The third region 30 contacts the second region 20.

At least a portion of the second region 20 is provided between the insulating portion 40 and the first region 10 in the first direction (the Z-axis direction). At least a portion of the second region 20 is provided between the third electrode 53 and the third region 30 in the first direction (the Z-axis direction). In the example, at least a portion of the insulating portion 40 is provided between the third electrode 53 and the second region 20 in the first direction (the Z-axis direction).

In the example, the insulating portion 40 includes a first insulating layer 41 and a second insulating layer 42. The second insulating layer 42 is provided between the first insulating layer 41 and the second region 20 in the first direction (the Z-axis direction). The first insulating layer 41 includes oxygen. The second insulating layer 42 includes nitrogen. The second insulating layer 42 does not include oxygen. Or, the concentration of oxygen in the second insulating layer 42 is lower than the concentration of oxygen in the first insulating layer 41. For example, the first insulating layer 41 includes silicon oxide. The second insulating layer 42 includes, for example, silicon nitride or silicon oxynitride. For example, the stability of the second region 20 is increased by providing the second insulating layer 42 including nitrogen between the second region 20 (e.g., AlN) and the first insulating layer 41 including oxygen. More stable characteristics are obtained easily.

In the embodiment, a thickness t3 along the first direction (the Z-axis direction) of the third region 30 (referring to FIG. 1) is thinner than a thickness t1 along the first direction of the first region 10 (referring to FIG. 1). For example, the thickness t1 of the first region 10 is 100 nm or more. The thickness t3 of the third region 30 is not less than 1 nm and not more than 20 nm.

The thickness t3 is the length along the first direction (the Z-axis direction). The at least a portion of the third region 30 recited above has a first surface 30a and a second surface 30b (referring to FIG. 1). The first surface 30a and the second surface 30b are aligned with the second direction (e.g., the X-axis direction). For example, these surfaces are along the X-Y plane. The first surface 30a is the surface on the first region 10 side. The first surface 30a opposes the first region 10. The second surface 30b opposes the second region 20. The distance along the first direction (the Z-axis direction) between the first surface 30a and the second surface 30b corresponds to the thickness t3.

A thickness t2 along the first direction (the Z-axis direction) of the second region 20 is thinner than the thickness t1 along the first direction of the first region 10 (referring to FIG. 1). In the embodiment, the thickness t2 is, for example, not less than 5 nm and not more than 500 nm.

For example, the first electrode 51 is electrically connected to the first partial region 11 of the first region 10. For example, the second electrode 52 is electrically connected to the second partial region 12 of the first region 10.

For example, the first electrode 51 functions as a source electrode. For example, the second electrode 52 functions as a drain electrode. For example, the third electrode 53 functions as a gate electrode. As described below, a carrier region is formed in the portion of the first region 10 on the third region 30 side.

As described above, the second region 20 includes $Al_{x2}Ga_{1-x2}N$ (0<x2≤1). The second region 20 has polarity. On the other hand, the polarity of the first region 10 is smaller than the polarity of the second region 20. For example, the first region 10 substantially does not have polarity.

Because such a second region 20 has polarization (e.g., spontaneous polarization), a carrier region is induced in the first region 10 via the third region 30 including the dielectric. A current flows between the first electrode 51 and the second electrode 52 via the carrier region. The induction of the carrier region can be controlled by the third electrode 53.

The carrier region includes, for example, a two-dimensional electron gas 10E. The semiconductor device 110 is, for example, a HEMT (High Electron Mobility Transistor). In other embodiments as described below, the carrier region may include a two-dimensional hole gas.

The orientation of the polarity of the second region 20 is the <0001> direction or the <000-1> direction. In the example shown in FIG. 1, the <0001> direction crosses the X-Y plane. In the example, the <0001> direction has a component in the direction from the first region 10 toward the second region 20. In another embodiment, the <000-1> direction may have a component in the direction from the first region 10 toward the second region 20.

The case will now be described where the <0001> direction of the second region 20 is aligned with the orientation from the first region 10 toward the second region 20. Hereinbelow, the orientation from the first region 10 toward the second region 20 is taken as the +Z orientation; and the orientation from the second region 20 toward the first region 10 is taken as the −Z orientation.

An example of simulation results of characteristics of the semiconductor device 110 will now be described.

Figure 2:
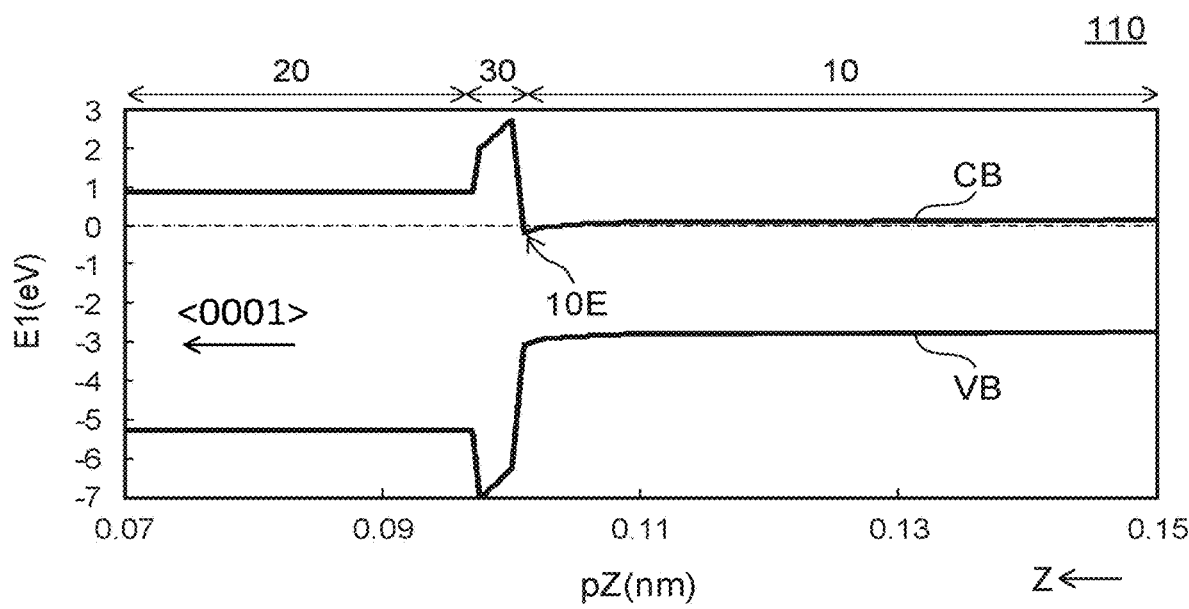
FIG. 2 is a schematic view illustrating characteristics of the semiconductor device according to the first embodiment.

FIG. 2 is a schematic view illustrating characteristics of the semiconductor device according to the first embodiment.

FIG. 2 illustrates simulation results of the characteristics of the semiconductor device 110. In FIG. 2, the horizontal axis is a position pZ (nm) along the Z-axis direction. The vertical axis is an energy E1 (eV). The energies of a conduction band CB and a valence band VB are shown in FIG. 2. In the example, the first region 10 is a 6H—SiC substrate. The second region 20 is AlN; and the thickness t2 of the second region 20 is 30 nm. The third region 30 is $SiO_2$; and the thickness t3 of the third region 30 is 3 nm.

As shown in FIG. 2, a local bottom is observed in the conduction band CB on the second region 20 side of the first region 10. The local bottom corresponds to the carrier region (e.g., the two-dimensional electron gas 10E).

For example, the first region 10 which is a SiC layer and the second region 20 which is an AlGaN layer (or an AlN layer) are included in the embodiment. On the other hand, there is a first reference example in which a GaN layer is used as the first region 10, and AlGaN layers are used as the second region 20 and the third region 30. The heat dissipation of SiC is higher than the heat dissipation of GaN. Therefore, the heat dissipation of the embodiment is higher than the heat dissipation of the first reference example.

For example, the breakdown voltage of SiC is higher than the breakdown voltage of GaN. For example, a higher breakdown voltage is obtained in the embodiment than in the first reference example.

On the other hand, there is a second reference example in which the second region 20 ($Al_{x2}Ga_{1-x2}N$ (0<x2≤1)) is provided in contact with the first region 10. The third region 30 is not provided in the second reference example. In the second reference example, the lattice length of the second region 20 is greatly affected by the lattice length of the first region 10. To simplify the description hereinbelow, the first region 10 is taken to be 6H—SiC; and the second region 20 is taken to be AlN. The unstrained a-axis direction lattice length (the lattice constant) of the first region 10 (6H—SiC) is 0.3073 nm. The unstrained a-axis direction lattice length (the lattice constant) of the second region 20 (the AlN) is 0.3112. When the second region 20 is grown on such a first region 10, the lattice length of the second region 20 is affected by the lattice length of the first region 10 and reduced. For example, compressive stress is applied to the second region 20.

When stress is applied to the second region 20, piezoelectric polarization occurs in addition to the spontaneous polarization. For example, in the case where tensile stress is applied to the second region 20, the orientation of the piezoelectric polarization generated based on the tensile stress is the same as the orientation (the <0001> direction) of the spontaneous polarization. Therefore, the magnitude of the polarization of the second region 20 is the sum of the spontaneous polarization and the piezoelectric polarization.

Conversely, in the case where compressive stress is applied to the second region 20, the orientation of the piezoelectric polarization generated based on the compressive stress is the reverse of the orientation (the <0001> direction) of the spontaneous polarization. Therefore, the magnitude of the polarization of the second region 20 corresponds to the difference between the spontaneous polarization and the piezoelectric polarization.

Carriers that correspond to the sum total of the spontaneous polarization and the piezoelectric polarization (the sum of the spontaneous polarization and the piezoelectric polarization or the difference between the spontaneous polarization and the piezoelectric polarization) are generated in the first region 10. The carrier density of the first region 10 can be increased by increasing the sum total of the spontaneous polarization and the piezoelectric polarization.

In the embodiment, the third region 30 is provided between the first region 10 and the second region 20. The transfer of the crystalline state of the first region 10 to the second region 20 can be suppressed by the third region 30. Thereby, the application of the compressive stress to the second region 20 can be suppressed. For example, the sum total of the spontaneous polarization and the piezoelectric polarization can be large. The carrier density of the first region 10 can be increased. For example, according to the embodiment, the ON-resistance can be low. According to the embodiment, a semiconductor device can be provided in which the characteristics can be improved.

In the embodiment, for example, the thickness t3 along the first direction (the Z-axis direction) of the third region 30 is thinner than the thickness t2 along the first direction of the second region 20. The thickness t3 is, for example, 1 nm or more. By setting the thickness t3 to be 1 nm or more, the transfer of the crystalline state of the first region 10 to the second region 20 can be suppressed. For example, the compressive stress of the second region 20 can be suppressed. The thickness t3 is, for example, 20 nm or less. In the case where the thickness t3 is excessively thick, the effects on the first region 10 of the polarization (the sum total of the spontaneous polarization and the piezoelectric polarization) generated in the second region 20 are weaker. There are cases where the carrier density of the first region 10 is insufficiently high. By setting the thickness t3 to be 20 nm or less, the effects of the polarization generated in the second region 20 are effectively applied to the first region 10. The carrier density of the first region 10 can be increased.

Examples of characteristics of the semiconductor device will now be described.

Figure 3A:
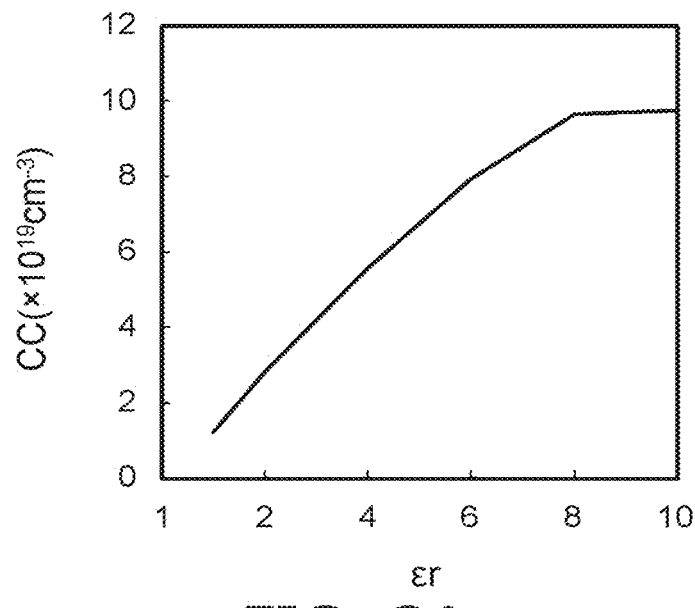
FIG. 3A and FIG. 3B are graphs illustrating characteristics of the semiconductor device.
Figure 3B:
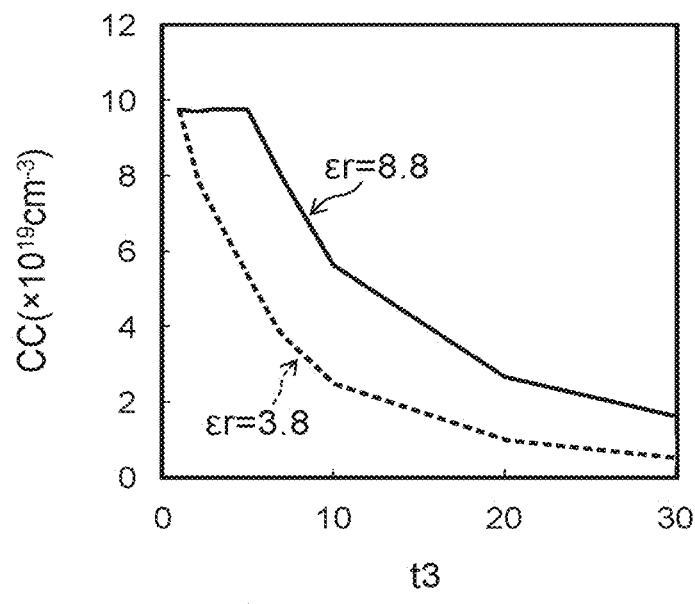

FIG. 3A and FIG. 3B are graphs illustrating characteristics of the semiconductor device.

These figures illustrate simulation results of the relationship between the characteristics of the third region 30 and the carrier concentration generated in the first region 10. The first region 10 is a 6H—SiC substrate in the model of the simulation. The second region 20 is an AlN layer of which the thickness t2 is 30 nm. The AlN layer is unstrained.

The thickness t3 of the third region 30 is 5 nm in FIG. 3A. The horizontal axis of FIG. 3A is a relative dielectric constant εr of the third region 30. The vertical axis of FIG. 3A is a carrier concentration CC ($\times 10^{19}$ cm$^{-3}$) generated in the region of the first region 10 on the third region 30 side. As shown in FIG. 3A, the carrier concentration CC increases as the relative dielectric constant εr increases.

The horizontal axis of FIG. 3B is the thickness t3 (nm) of the third region 30. The vertical axis of FIG. 3B is the carrier concentration CC ($\times 10^{19}$ cm$^{-3}$) generated in the region of the first region 10 on the third region 30 side. The characteristic when the relative dielectric constant εr is 3.8 and the characteristic when the relative dielectric constant εr is 8.8 are shown in FIG. 3B. As shown in FIG. 3B, the carrier concentration CC increases as the thickness t3 decreases.

In the second reference example in which the second region 20 contacts the first region 10 without providing the third region 30, the lattice length of the a-axis direction of the second region 20 is the same as the lattice length (e.g., the unstrained lattice constant) of the a-axis direction of the first region 10. In the embodiment, the lattice of the second region 20 can be relaxed by providing the third region 30. In the embodiment, the lattice length of the second region 20 approaches the unstrained lattice length (the lattice constant) of the material of the second region 20.

The following "relaxation rate α" is introduced as a parameter corresponding to the relaxation state of the lattice. The first material recited above included in the first region 10 has a first lattice constant when unstrained. The first lattice constant is a lattice length in one axis direction crossing the first direction (the Z-axis direction). The $Al_{x2}Ga_{1-x2}N$ (0<x2≤1) that is included in the second region 20 has a second lattice constant when unstrained. The second lattice constant is a lattice length in the axis direction recited above. The axis direction recited above is, for example, the a-axis direction of the $Al_{x2}Ga_{1-x2}N$ (0<x2≤1). For example, in the case where the first region 10 is 6H—SiC, the first lattice constant (unstrained) is about 0.3073 nm. For example, in the case where the second region 20 is AlN, the second lattice constant (unstrained) is about 0.3112 nm. The second region 20 has a second lattice length in the axis direction. The second lattice length is the actual lattice length of the second region 20 of the semiconductor device 110. The relaxation rate α is defined as the "ratio of the absolute value of the difference between the first lattice constant and the second lattice length to the absolute value of the difference between the first lattice constant and the second lattice constant."

For example, C1 is the first lattice constant; C2 is the second lattice constant; and L2 is the second lattice length. The relaxation rate α corresponds to |C1−L2|/|C1−C2|.

The relaxation rate α is 1 in the case where the second lattice length L2 of the second region 20 is the same as the second lattice constant C2. This case corresponds to full relaxation. On the other hand, the relaxation rate α is 0 in the case where the second lattice length L2 of the second region 20 is the same as the first lattice constant C1. In such a case, the lattice of the second region 20 fully matches the lattice of the first region 10; and a large compressive strain is generated in the second region 20.

In the embodiment, the relaxation rate α (the ratio recited above) is greater than 0. For example, the relaxation rate α is 0.15 or more. The relaxation rate α may be 0.58 or more. The relaxation rate α may be 0.74 or more.

By setting the relaxation rate α to be greater than 0 (e.g., 0.15 or more), the compressive strain in the second region 20 is weaker compared to the case where the lattice of the second region 20 fully matches the lattice of the first region 10. Thereby, the sum total of the spontaneous polarization and the piezoelectric polarization can be large. The carrier density of the first region 10 can be higher.

Information relating to the lattice length recited above (including the lattice constant) is obtained by, for example, X-ray diffraction analysis, etc. Information relating to the lattice constant of the second region 20 is obtained based on, for example, Vegard's law, analysis results of the composition of the second region 20, etc. Information relating to the lattice constant of the first region 10 is obtained based on, for example, analysis results of the composition of the first region 10, etc.

Figure 4A:
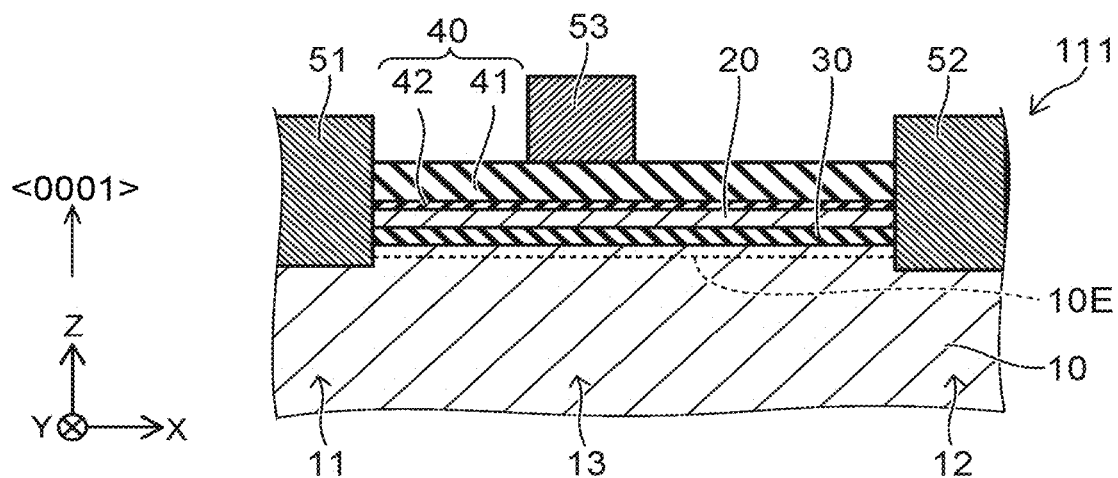
FIG. 4A and FIG. 4B are schematic cross-sectional views illustrating semiconductor devices according to the first embodiment.
Figure 4B:
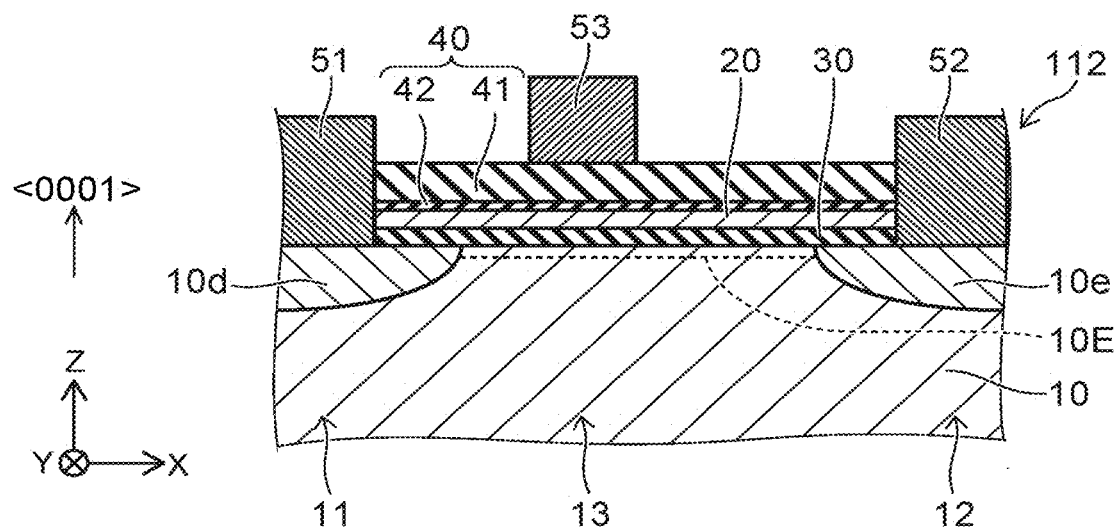

FIG. 4A and FIG. 4B are schematic cross-sectional views illustrating semiconductor devices according to the first embodiment.

In a semiconductor device 111 as shown in FIG. 4A, the configurations of the first electrode 51 and the second electrode 52 are different from the configurations of the first electrode 51 and the second electrode 52 of the semiconductor device 110. Otherwise, the configuration of the semiconductor device 111 is the same as the configuration of the semiconductor device 110.

In the semiconductor device 111, at least a portion of the first electrode 51 overlaps the first region 10 in the second direction (e.g., the X-axis direction). At least a portion of the second electrode 52 overlaps the first region 10 in the second direction. At least one of the at least a portion of the first electrode 51 or the at least a portion of the second electrode 52 may be buried in the first region 10.

As shown in FIG. 4B, a fourth region 10d and a fifth region 10e are provided in a semiconductor device 112. Otherwise, the configuration of the semiconductor device 112 is the same as the configuration of the semiconductor device 110.

The fourth region 10d is provided between the first partial region 11 and the first electrode 51. The fifth region 10e is provided between the second partial region 12 and the second electrode 52. The impurity concentration in the fourth region 10d is higher than the impurity concentration in the first partial region 11. The impurity concentration in the fifth region 10e is higher than the impurity concentration in the second partial region 12.

The impurity includes, for example, at least one selected from the group consisting of nitrogen (N) and phosphorus (P). For example, the fourth region 10d and the fifth region 10e are obtained by implanting these elements as the impurity into the region used to form the first region 10.

The fourth region 10d and the fifth region 10e may be provided in the semiconductor device 111 recited above.

Second Embodiment

Figure 5:
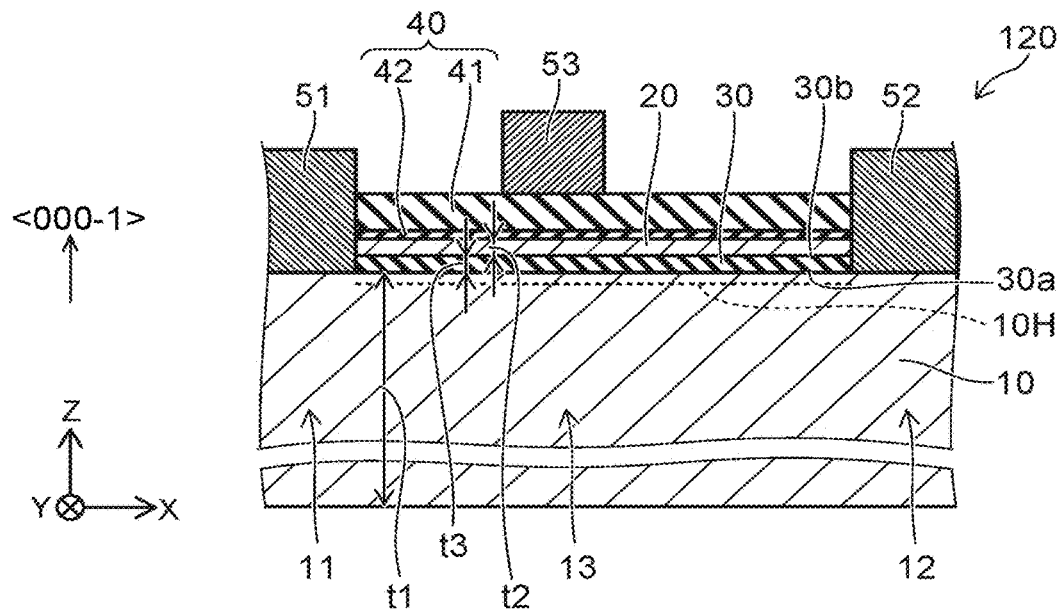
FIG. 5 is a schematic cross-sectional view illustrating a semiconductor device according to a second embodiment.

FIG. 5 is a schematic cross-sectional view illustrating a semiconductor device according to a second embodiment.

As shown in FIG. 5, the semiconductor device 120 according to the second embodiment also includes the first region 10, the second region 20, the third region 30, and the first to third electrodes 51 to 53. The arrangement of these components in the semiconductor device 120 are the same as the arrangement in the semiconductor device 110. In the semiconductor device 120, the <000-1> direction has a component in the direction from the first region 10 toward the second region 20.

Hereinbelow, it is taken that the <000-1> direction of the second region 20 is aligned with the orientation (the +Z orientation) from the first region 10 toward the second region 20.

Figure 6:
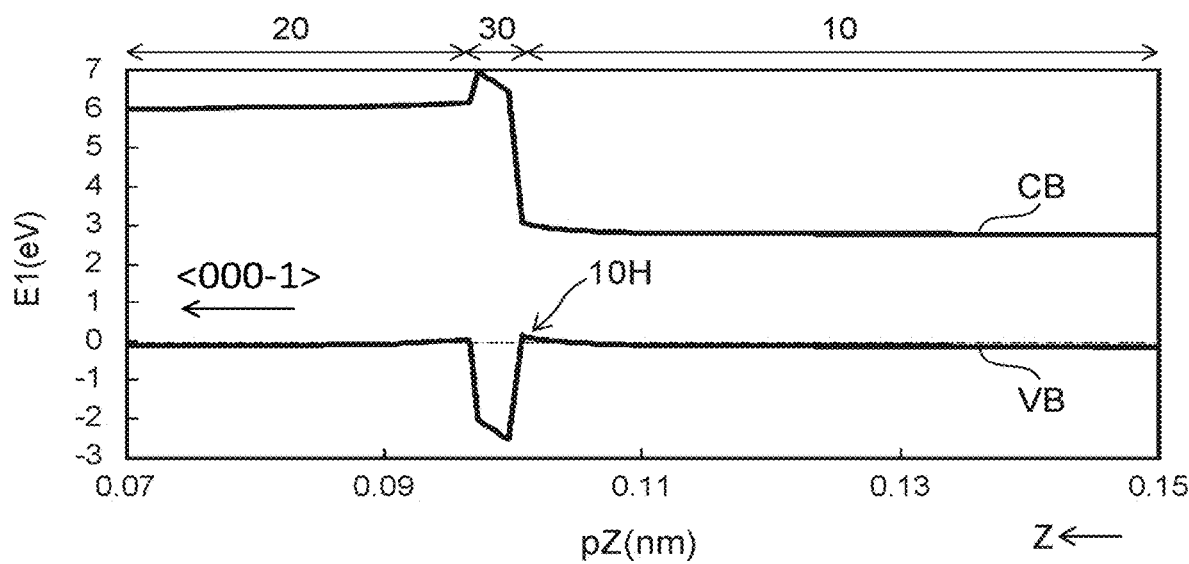
FIG. 6 is a schematic view illustrating characteristics of the semiconductor device according to the second embodiment.

FIG. 6 is a schematic view illustrating characteristics of the semiconductor device according to the second embodiment.

FIG. 6 illustrates simulation results of the characteristics of the semiconductor device 120. In FIG. 6, the horizontal axis is the position pZ (nm) along the Z-axis direction. The vertical axis is the energy E1 (the eV). The energies of the conduction band CB and the valence band VB are shown in FIG. 6. In the example, the first region 10 is a 6H—SiC substrate. The second region 20 is AlN; and the thickness t2 of the second region 20 is 30 nm. The third region 30 is $SiO_2$; and the thickness t3 of the third region 30 is 3 nm.

As shown in FIG. 6, a local peak of the valence band VB is observed in the first region 10 on the third region 30 side. The local peak corresponds to the carrier region (e.g., a two-dimensional hole gas 10H).

In the semiconductor device 120 as well, for example, the compressive stress in the second region 20 can be suppressed. Thereby, the two-dimensional hole gas 10H that has a high concentration is obtained. According to the embodiment, for example, the ON-resistance can be low. According to the embodiment, a semiconductor device can be provided in which the characteristics can be improved.

In the second embodiment as well, the relaxation rate α is greater than 0. For example, the relaxation rate α may be 0.15 or more. The relaxation rate α may be 0.58 or more. The relaxation rate α may be 0.74 or more.

Figure 7A:
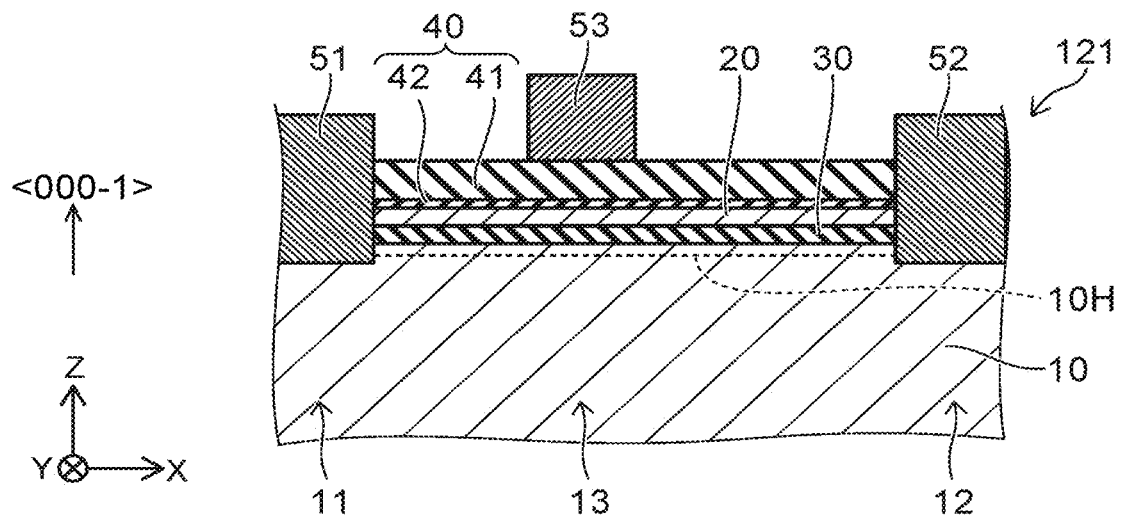
FIG. 7A and FIG. 7B are schematic cross-sectional views illustrating semiconductor devices according to the second embodiment.
Figure 7B:
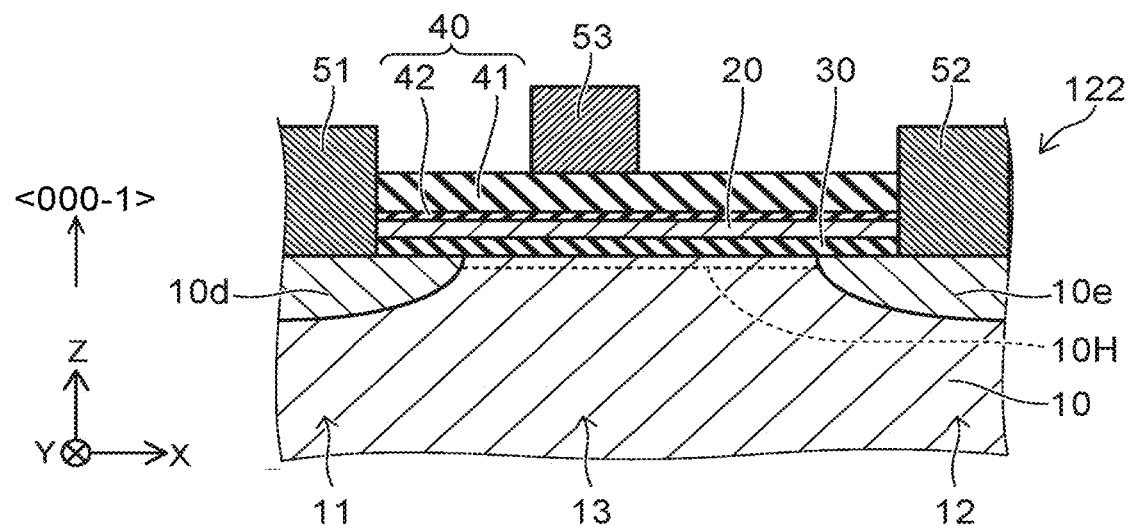
Figure 9A:
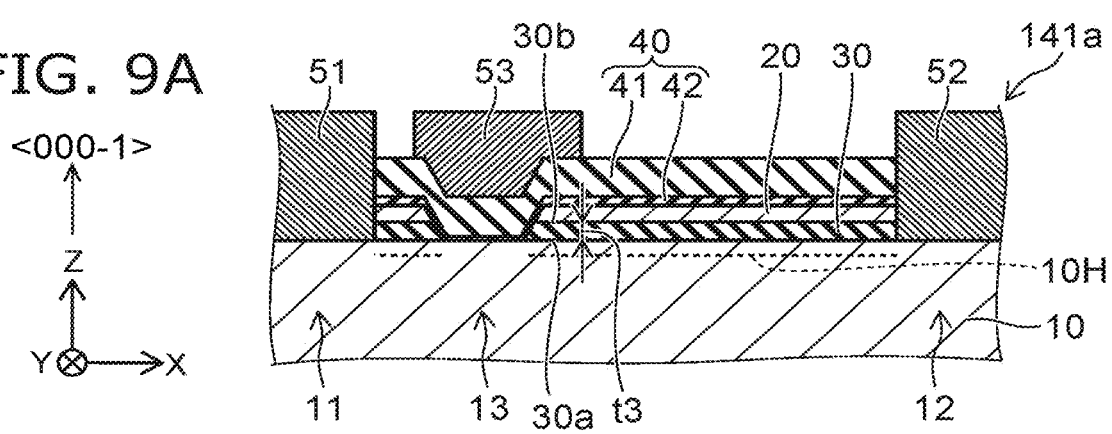
FIG. 9A to FIG. 9D are schematic cross-sectional views illustrating semiconductor devices according to a fourth embodiment.
Figure 9B:
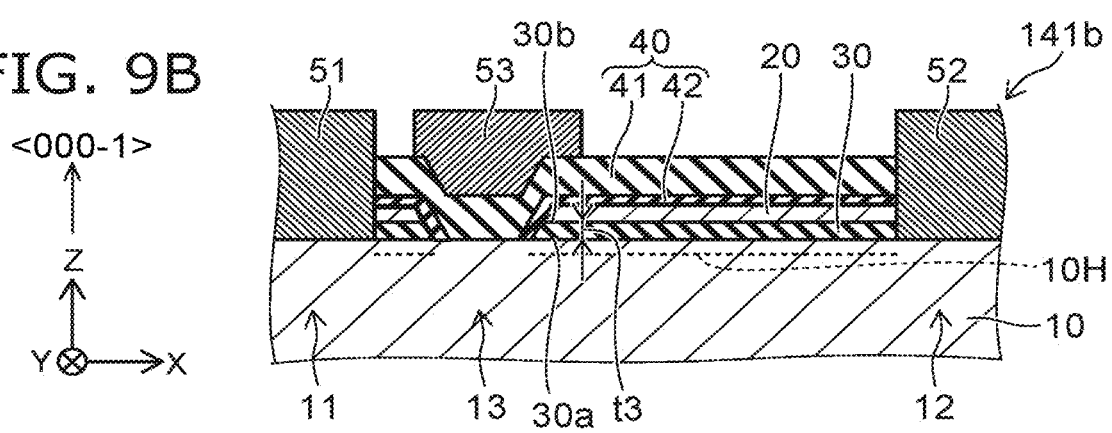
Figure 9C:
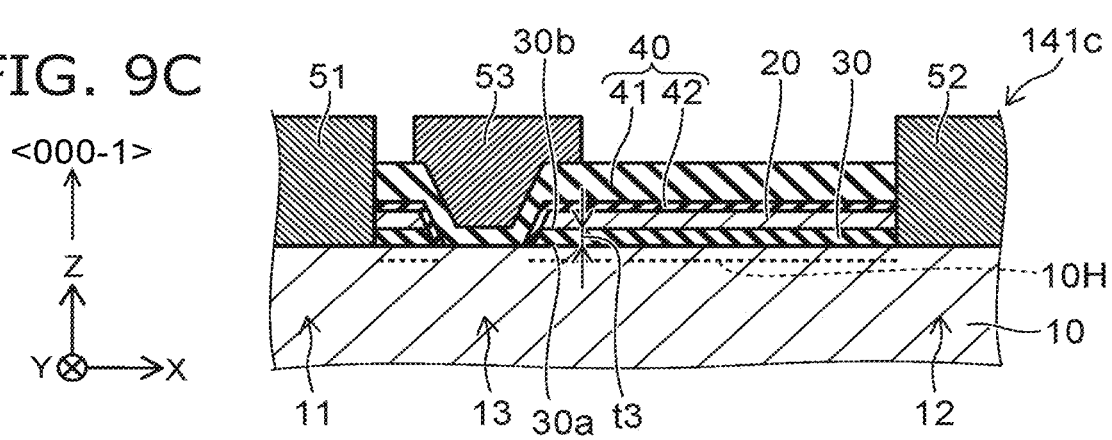
Figure 9D:
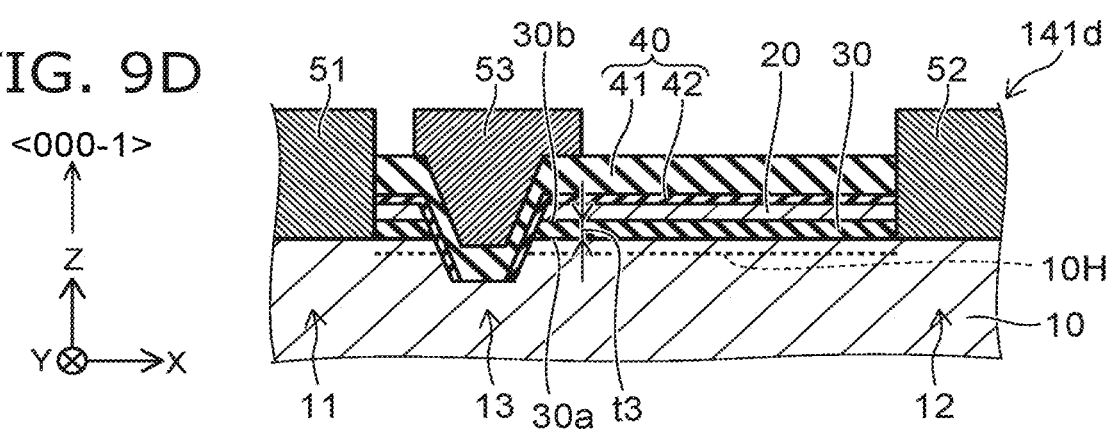

FIG. 7A and FIG. 7B are schematic cross-sectional views illustrating semiconductor devices according to the second embodiment.

In the second embodiment as in a semiconductor device 121 shown in FIG. 7A, at least a portion of the first electrode 51 may overlap the first region 10 in the second direction (e.g., the X-axis direction). At least a portion of the second electrode 52 may overlap the first region 10 in the second direction.

As in a semiconductor device 122 shown in FIG. 7B, the fourth region 10d and the fifth region 10e may be provided. The fourth region 10d is provided between the first partial region 11 and the first electrode 51. The fifth region 10e is provided between the second partial region 12 and the second electrode 52. The impurity concentration in the fourth region 10d is higher than the impurity concentration in the first partial region 11. The impurity concentration in the fifth region 10e is higher than the impurity concentration in the second partial region 12.

In the second embodiment, the impurity includes, for example, at least one selected from the group consisting of aluminum (Al) and boron (B). For example, the fourth region 10d and the fifth region 10e are obtained by implanting these elements as the impurity into the region used to form the first region 10.

The fourth region 10d and the fifth region 10e may be provided in the semiconductor device 121 recited above.

In the first and second embodiments as well, the Al composition ratio x2 of the second region 20 is, for example, 0.5 or more. Thereby, for example, a high carrier concentration is obtained easily. The Al composition ratio x2 may be 0.8 or more. The Al composition ratio x2 may be 0.9 or more, and may be substantially 1.

Third Embodiment

FIG. 8A to FIG. 8D are schematic cross-sectional views illustrating semiconductor devices according to a third embodiment.

As shown in these drawings, semiconductor devices 140a to 140d include the first region 10, the second region 20, the third region 30, the first to third electrodes 51 to 53, and the insulating portion 40. In the semiconductor devices 140a to 140d, the <0001> direction is aligned with the orientation from the first region 10 toward the second region 20. Other than the description recited below, for example, the configurations of the semiconductor devices 140a to 140d are similar to the configuration of the semiconductor device 110.

In the semiconductor devices 140a to 140d, a portion of the second region 20 is provided between the third electrode 53 and the first region 10 in the first direction (the Z-axis direction). Another portion of the second region 20 does not overlap the third electrode 53 in the first direction (the Z-axis direction). For example, a hole (or a recess) is provided in the second region 20; and a portion of the insulating portion 40 is provided in the hole (or the recess).

In the semiconductor devices 140a to 140d, for example, a portion of the insulating portion 40 overlaps the second region 20 in the second direction (e.g., the X-axis direction).

In the semiconductor devices 140c and 140d, at least a portion of the third electrode 53 overlaps the third region 30 in the second direction (e.g., the X-axis direction).

In the semiconductor device 140d, a portion of the insulating portion 40 overlaps the first region 10 in the second direction (e.g., the X-axis direction). In the example of the semiconductor device 140d, at least a portion of the third electrode 53 overlaps the second region 20 in the second direction (the X-axis direction). In the example of the semiconductor device 140d, at least a portion of the third electrode 53 overlaps the first region 10 in the second direction (the X-axis direction).

In the semiconductor devices 140a to 140d, a portion of the first insulating layer 41 is between the third partial region 13 and the third electrode 53 in the first direction (the Z-axis direction).

As in the semiconductor devices 140b to 140d, the portion of the first insulating layer 41 recited above may contact the third partial region 13 in the first direction (the Z-axis direction).

For example, a normally-OFF operation is obtained in the semiconductor devices 140a to 140d. In the semiconductor devices 140a to 140d, a carrier region (e.g., the two-dimensional electron gas 10E) that has a high carrier concentration is obtained.

In the semiconductor device 140a, a portion of the second region 20 (the portion that overlaps the third electrode 53) may be thinner than the other portions of the second region 20. Even in such a case, for example, the normally-OFF operation is obtained.

Fourth Embodiment

FIG. 9A to FIG. 9D are schematic cross-sectional views illustrating semiconductor devices according to a fourth embodiment.

As shown in these drawings, semiconductor devices 141a to 141d also include the first region 10, the second region 20, the third region 30, the first to third electrodes 51 to 53, and the insulating portion 40. In the semiconductor devices 141a to 141d, the <000-1> direction is aligned with the orientation from the first region 10 toward the second region 20. Otherwise, the configurations of the semiconductor devices 141a to 141d are respectively similar to the configurations of the semiconductor devices 140a to 140d. In the semiconductor devices 141a to 141d, for example, a carrier region (e.g., the two-dimensional hole gas 10H) that has a high carrier concentration is obtained.

In the third embodiment and the fourth embodiment, at least part of the portion of the second region 20 overlapping the third electrode 53 in the first direction may be 5 nm or less.

In the first to fourth embodiments recited above, for example, the third region 30 can be formed by at least one method of chemical vapor deposition (CVD), sputtering, atomic layer deposition (ALD), metal-organic vapor phase epitaxy (MOCVD), molecular beam epitaxy (MBE), etc.

Fifth Embodiment

Figure 10:
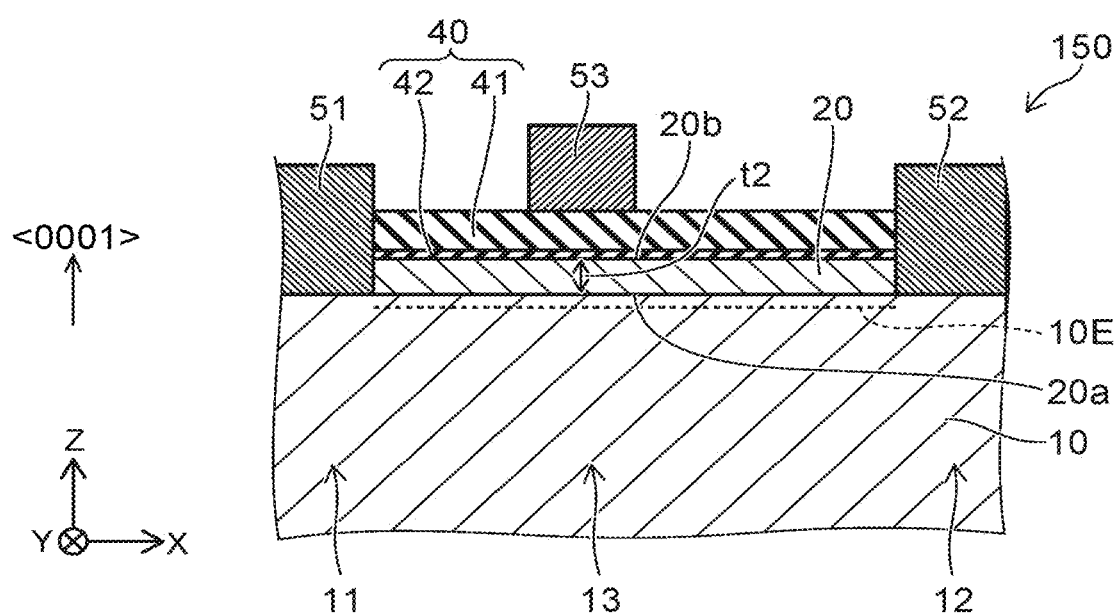
FIG. 10 is a schematic cross-sectional view illustrating a semiconductor device according to a fifth embodiment.

FIG. 10 is a schematic cross-sectional view illustrating a semiconductor device according to a fifth embodiment.

As shown in FIG. 10, the semiconductor device 150 according to the fifth embodiment includes the first region 10, the second region 20, and the first to third electrodes 51 to 53. The insulating portion 40 is further provided in the example. The third region 30 of the semiconductor device 110 is not provided in the semiconductor device 150. Otherwise, the configuration of the semiconductor device 150 may be the same as the configuration of the semiconductor device 110.

In the semiconductor device 150 as well, the first region 10 includes the first material. The first material includes at least one selected from the group consisting of silicon carbide, silicon, carbon, and germanium. The first region 10 includes the first partial region 11, the second partial region 12, and the third partial region 13. The first region 10 includes, for example, a crystal.

The direction from the first partial region 11 toward the first electrode 51 is aligned with the first direction (the Z-axis direction). The direction from the second partial region 12 toward the second electrode 52 is aligned with the first direction. The direction from the third partial region 13 toward the third electrode 53 is aligned with the first direction. The second direction (e.g., the X-axis direction) from the first electrode 51 toward the second electrode 52 crosses the first direction. The position of the third electrode 53 in the second direction is between the position of the first electrode 51 in the second direction and the position of the second electrode 52 in the second direction.

The second region 20 includes $Al_{x2}Ga_{1-x2}N$ ($0<x2\leq1$). For example, the second region 20 includes AlN. At least a portion of the second region 20 is provided between the first electrode 51 and the second electrode 52 in the second direction. The second region 20 includes, for example, a crystal.

In the embodiment, the thickness t2 along the first direction of the second region 20 is, for example, not less than 10 nm and not more than 500 nm. Thereby, the high relaxation rate α is easier to obtain. The thickness t2 of the second region 20 is the thickness (the length) along the first direction (the Z-axis direction). At least a portion of the second region 20 has a third surface 20a and a fourth surface 20b (referring to FIG. 10). The third surface 20a and the fourth surface 20b are aligned with the second direction (e.g., the X-axis direction). For example, these surfaces are along the X-Y plane. The third surface 20a is the surface on the first region 10 side. The third surface 20a opposes the first region 10. The fourth surface 20b is the surface opposite to the third surface 20a. In the example, the fourth surface 20b opposes the insulating portion 40. The distance along the first direction (the Z-axis direction) between the third surface 20a and the fourth surface 20b corresponds to the thickness t2.

In the semiconductor device 150, the relaxation rate α is greater than 0. For example, the first material of the first region 10 has the first lattice constant (C1) in one axis direction when unstrained. The $Al_{x2}Ga_{1-x2}N$ ($0<x2\leq1$) has the second lattice constant (C2) in the axis direction recited above when unstrained. The axis direction recited above crosses the first direction. The axis direction recited above is, for example, the a-axis of the second region 20. The second region 20 has the second lattice length (L2) in the axis direction recited above. In the semiconductor device 150, the ratio (the relaxation rate α) of the absolute value of the difference between the first lattice constant and the second lattice length to the absolute value of the difference between the first lattice constant and the second lattice constant is greater than 0. The ratio is, for example, 0.15 or more. Thereby, the compressive strain in the second region 20 can be suppressed; and the sum total of the spontaneous polarization and the piezoelectric polarization can be large. The carrier density of the first region 10 can be higher.

For example, the relaxation rate α can be controlled by modifying the conditions when forming the second region 20. An example will now be described.

Figure 11A:
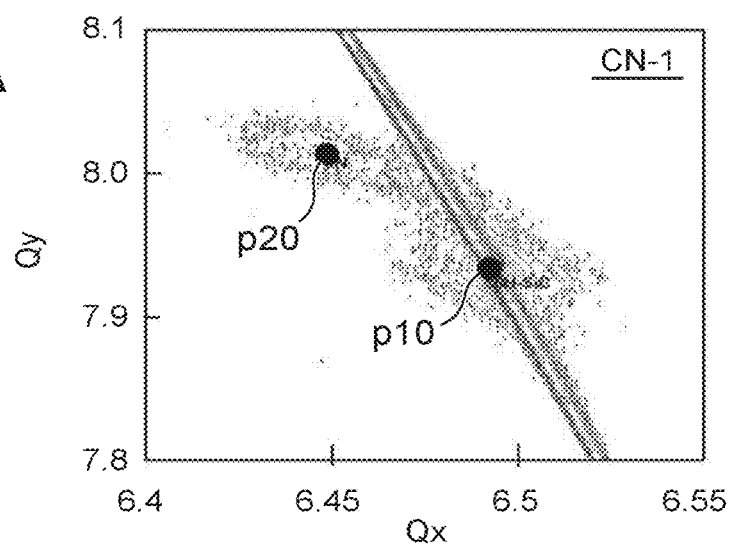
FIG. 11A to FIG. 11C are graphs illustrating characteristics of the semiconductor device.
Figure 11B:
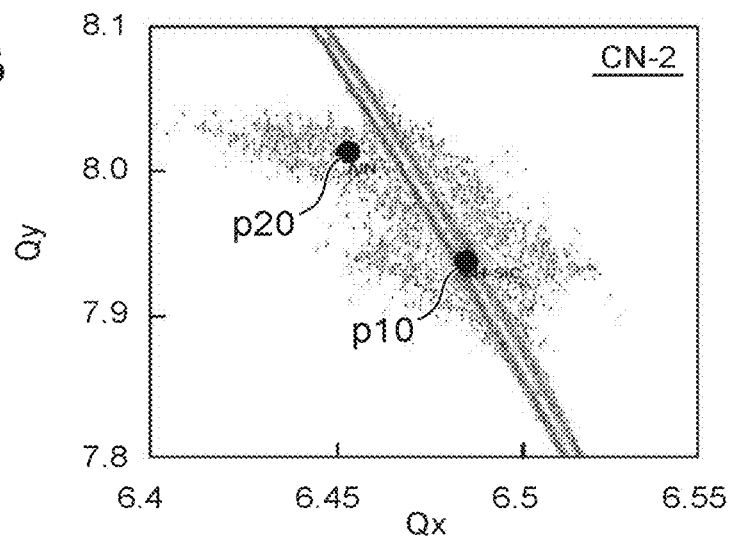
Figure 11C:
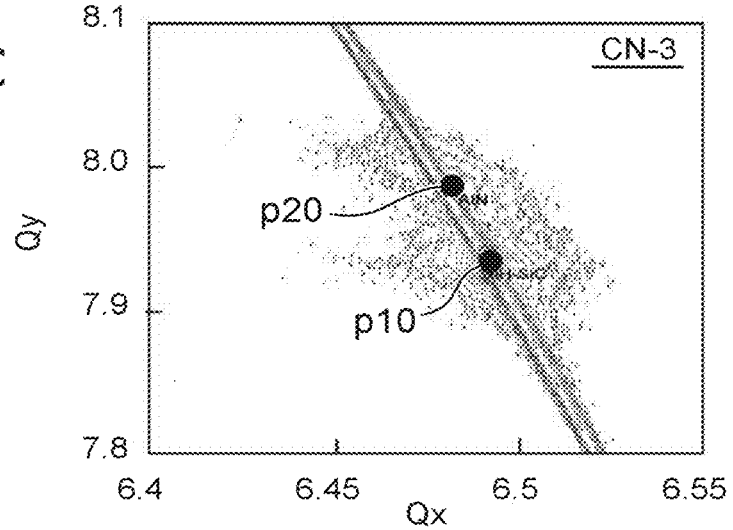

FIG. 11A to FIG. 11C are graphs illustrating characteristics of the semiconductor device.

These figures are examples of reciprocal lattice mapping images of X-ray diffraction measurements of first to third samples CN-1 to CN-3. The horizontal axis is a reciprocal Qx (nm$^{-1}$) of the lattice plane spacing in the (11-20) plane of the <11-20> direction perpendicular to the growth direction. The reciprocal Qx is a value proportional to the reciprocal of the lattice spacing of the a-axis. The vertical axis is a reciprocal Qy (nm$^{-1}$) of the lattice plane spacing of the plane of the <0001> direction parallel to the growth direction. The reciprocal Qy is a value proportional to the reciprocal of the lattice spacing of the c-axis.

In the first to third samples CN-1 to CN-3, the first region 10 is 6H—SiC. A crystal of AlN used to form the second region 20 is grown on the first region 10 by modifying the growth conditions. In the example, the flow rate ratio of the source gas is modified. For the first sample CN-1, the ratio of the flow rate of the Group III source material to the flow rate of ammonia is 250000. For the second sample CN-2, the ratio of the flow rate of the Group III source material to the flow rate of ammonia is 8300. For the third sample CN-3, the ratio of the flow rate of the Group III source material to the flow rate of ammonia is 210. In these figures, a point p10 corresponds to the lattice of the first region 10. A point p20 corresponds to the lattice of the second region 20.

It can be seen from these figures that the distance in the reciprocal Qx direction between the point p10 and the point p20 changes greatly as the growth conditions are modified. Also, the position of the point p20 changes greatly as the growth conditions are modified. The lattice length (the second lattice length) of the second region 20 is dependent on the growth conditions.

For example, the relaxation rate α of the first sample CN-1 is 0.74. For example, the relaxation rate α of the second sample CN-2 is 0.58. For example, the relaxation rate α of the third sample CN-3 is 0.15.

In the embodiment, for example, the relaxation rate α can be set to be, for example, 0.15 or more by modifying the growth conditions. For example, the relaxation rate α can be set to be, for example, 0.58 or more by modifying the growth conditions. For example, the relaxation rate α can be set to be, for example, 0.74 or more by modifying the growth conditions. The compressive stress in the second region 20 can be suppressed by the high relaxation rate α.

Figure 12:
FIG. 12 is a microscope photograph illustrating the semiconductor device according to the fifth embodiment.

FIG. 12 is a microscope photograph illustrating the semiconductor device according to the fifth embodiment.

FIG. 12 is an example of a TEM image of the cross section of a sample made using the growth conditions of the first sample CN-1. As shown in FIG. 12, a region 20r and a region 20s are observed in the second region 20 formed on the first region 10. The region 20r is provided between the region 20s and the first region 10. As shown in FIG. 12, the dislocation density in the region 20r is higher than the dislocation density in the region 20s. In such a region 20r, a disturbance of the crystal occurs due to the lattice mismatch between the second region 20 and the first region 10. The lattice is relaxed by the disturbance of the crystal. For example, the region 20r is a transition region of the lattice. High uniformity is observed in the region 20s. A high relaxation rate α is obtained in the region 20s.

Figure 13:
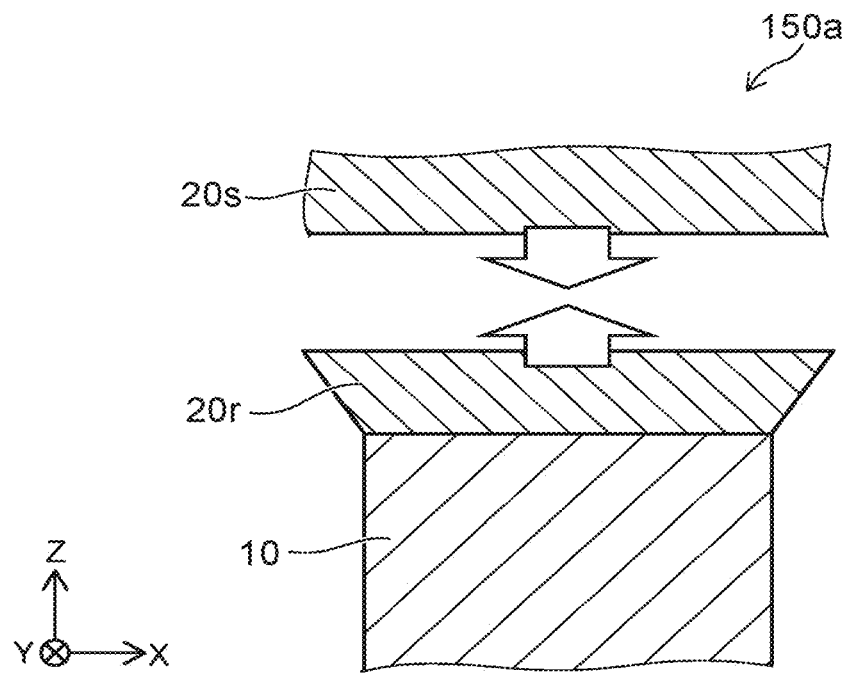
FIG. 13 is a schematic cross-sectional view illustrating the semiconductor device according to the fifth embodiment.

FIG. 13 is a schematic cross-sectional view illustrating the semiconductor device according to the fifth embodiment.

FIG. 13 illustrates a portion of a semiconductor device 150a according to the fifth embodiment; and the first to third electrodes 51 to 53 are not illustrated. In the semiconductor device 150a, the region 20r which is a portion of the second region 20 is formed on the first region 10. On the other hand, the region 20s where the strain is small is separately formed. For example, this region 20s is bonded to the region 20r. By such a configuration as well, a high relaxation rate α is obtained.

Figure 14A:
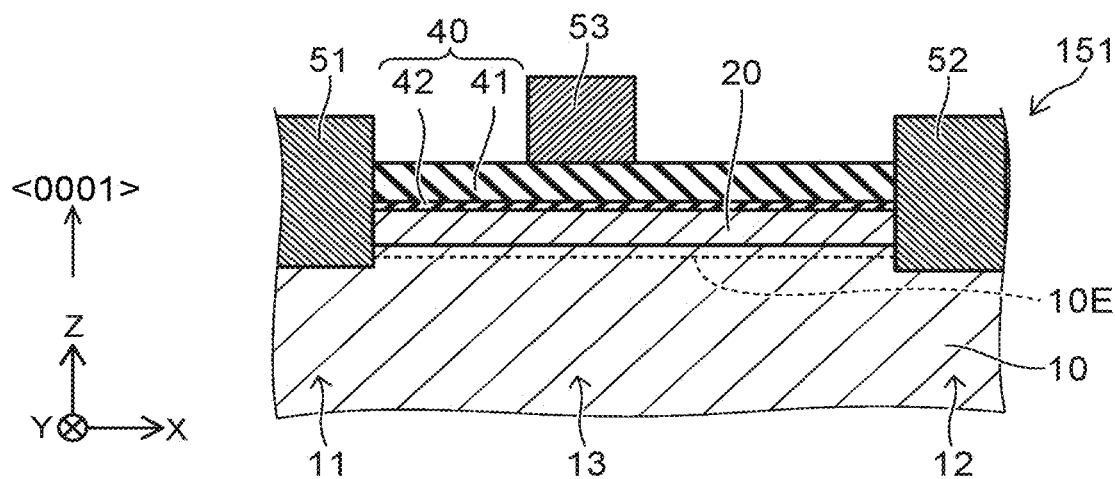
FIG. 14A and FIG. 14B are schematic cross-sectional views illustrating semiconductor devices according to the third embodiment.
Figure 14B:
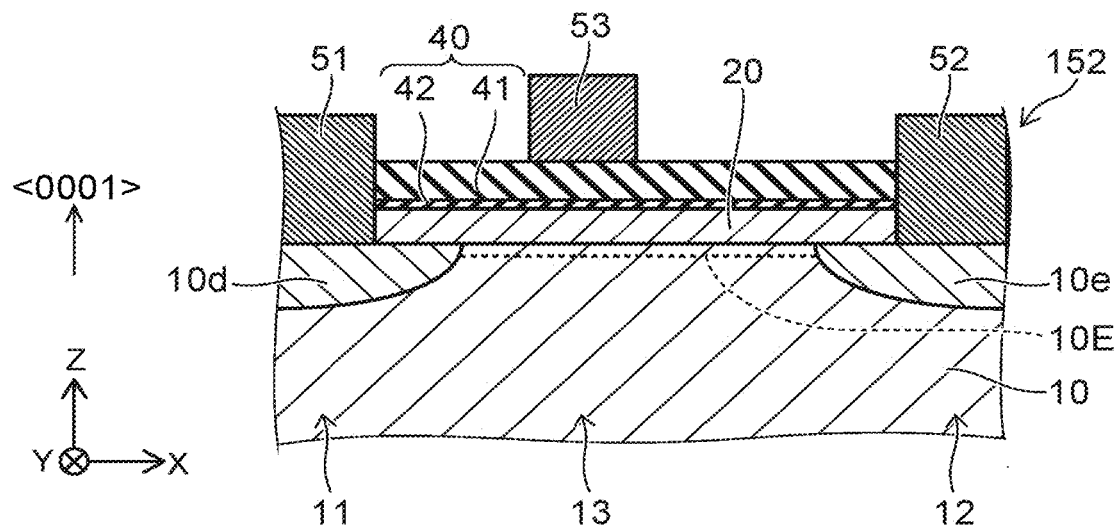

FIG. 14A and FIG. 14B are schematic cross-sectional views illustrating semiconductor devices according to the third embodiment.

In a semiconductor device 151 as shown in FIG. 14A, at least a portion of the first electrode 51 overlaps the first region 10 in the second direction (e.g., the X-axis direction). At least a portion of the second electrode 52 overlaps the first region 10 in the second direction. At least one of the at least a portion of the first electrode 51 or the at least a portion of the second electrode 52 may be buried in the first region 10.

As shown in FIG. 14B, the fourth region 10d and the fifth region 10e may be provided in the semiconductor device 152. The impurity concentration in the fourth region 10d is higher than the impurity concentration in the first partial region 11. The impurity concentration in the fifth region 10e is higher than the impurity concentration in the second partial region 12. The impurity includes, for example, at least one selected from the group consisting of nitrogen (N) and phosphorus (P). For example, the fourth region 10d and the fifth region 10e are obtained by implanting these elements as the impurity into the region used to form the first region 10. The fourth region 10d and the fifth region 10e may be provided in the semiconductor device 151 recited above.

Sixth Embodiment

Figure 15:
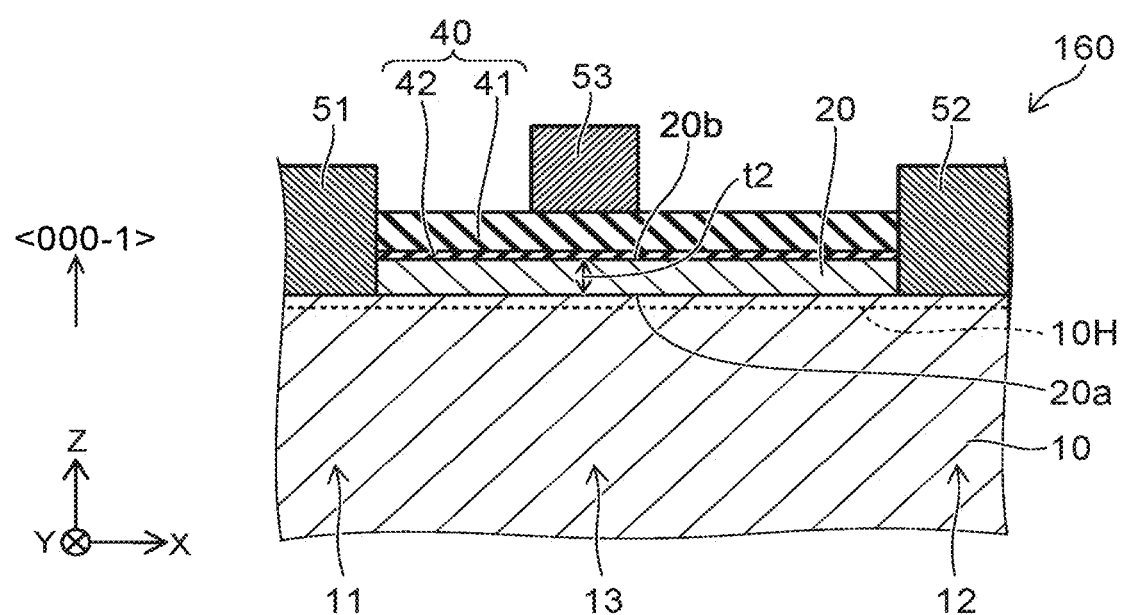
FIG. 15 is a schematic cross-sectional view illustrating a semiconductor device according to a sixth embodiment.

FIG. 15 is a schematic cross-sectional view illustrating a semiconductor device according to a sixth embodiment.

As shown in FIG. 15, the semiconductor device 160 according to the sixth embodiment also includes the first region 10, the second region 20, and the first to third electrodes 51 to 53. In the semiconductor device 120, the <000-1> direction of the second region 20 has a component in the orientation (the +Z orientation) from the first region 10 toward the second region 20. In such a case as well, a carrier region (e.g., the two-dimensional hole gas 10H) is obtained. In the semiconductor device 160 as well, the relaxation rate α is greater than 0. For example, the relaxation rate α may be 0.15 or more. The relaxation rate α may be 0.58 or more. The relaxation rate α may be 0.74 or more. In the semiconductor device 160 as well, for example, the compressive stress in the second region 20 can be suppressed. Thereby, the two-dimensional hole gas 10H that has a high concentration is obtained. According to the embodiment, for example, the ON-resistance can be low.

Figure 16A:
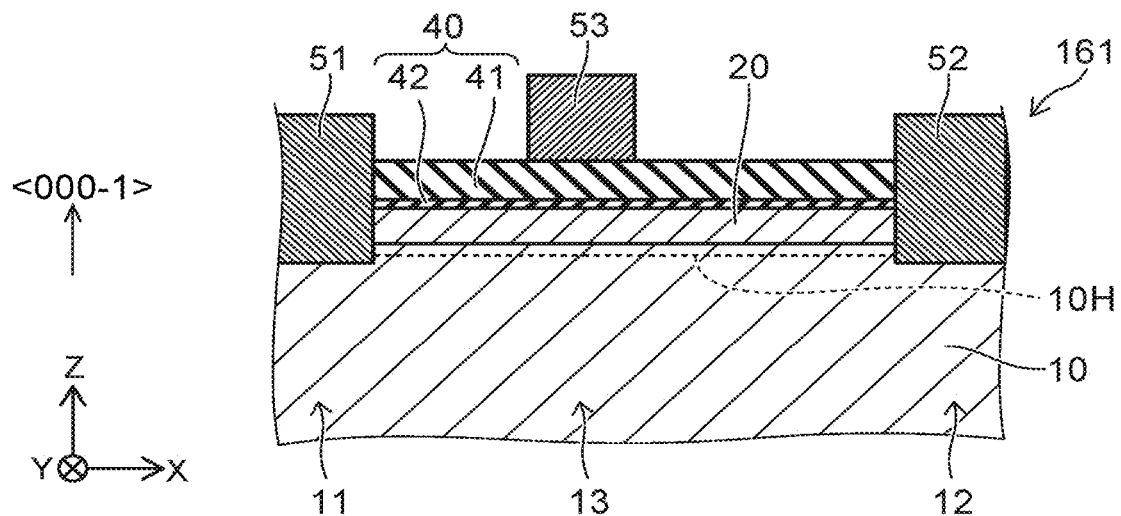
FIG. 16A and FIG. 16B are schematic cross-sectional views illustrating semiconductor devices according to the sixth embodiment.
Figure 16B:
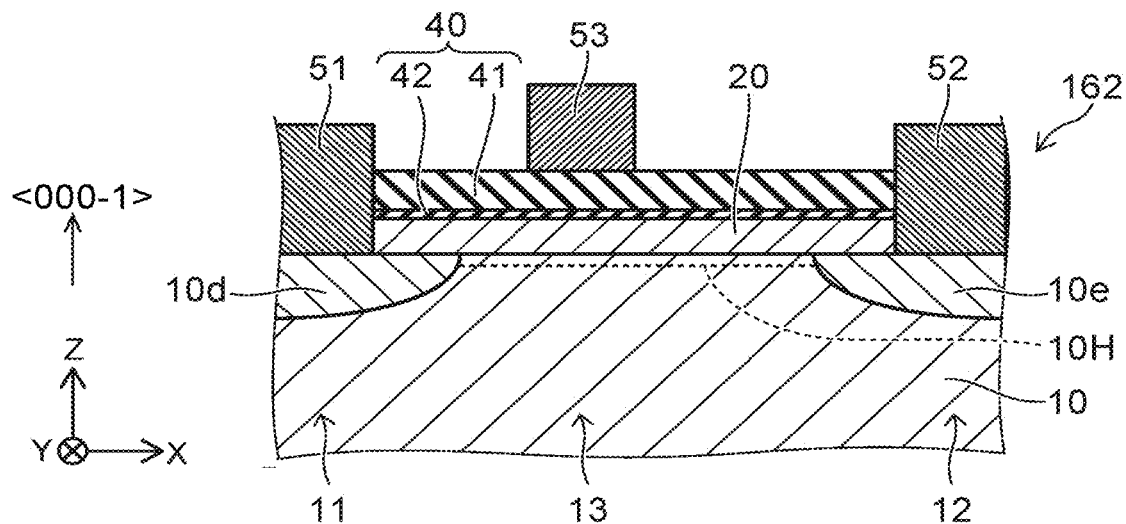
Figure 17A:
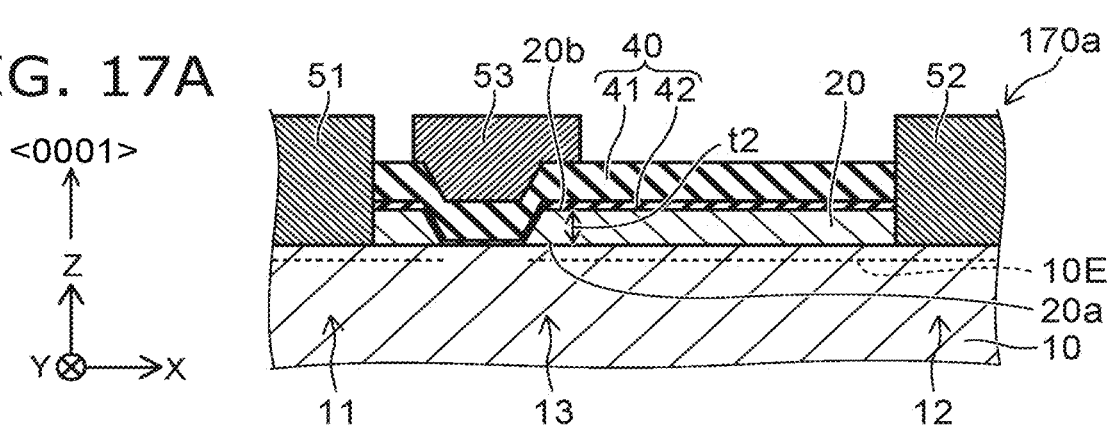
FIG. 17A to FIG. 17D are schematic cross-sectional views illustrating semiconductor devices according to a seventh embodiment.
Figure 17B:
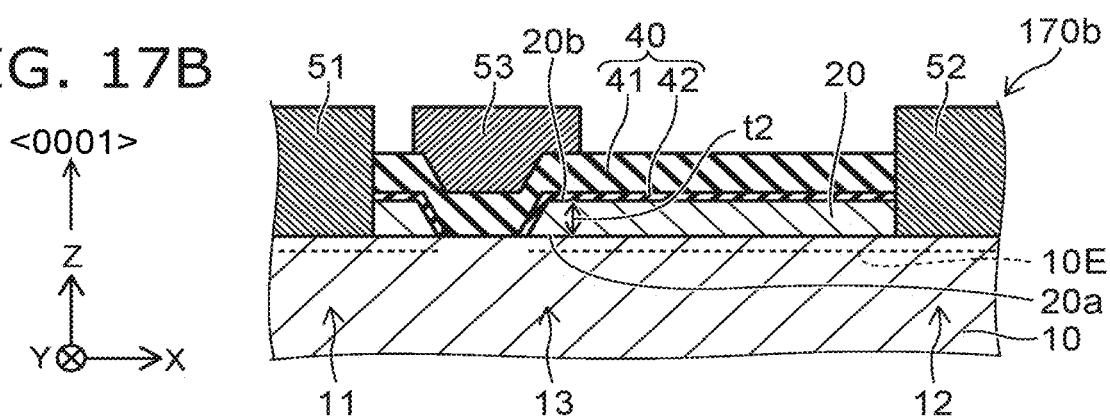
Figure 17C:
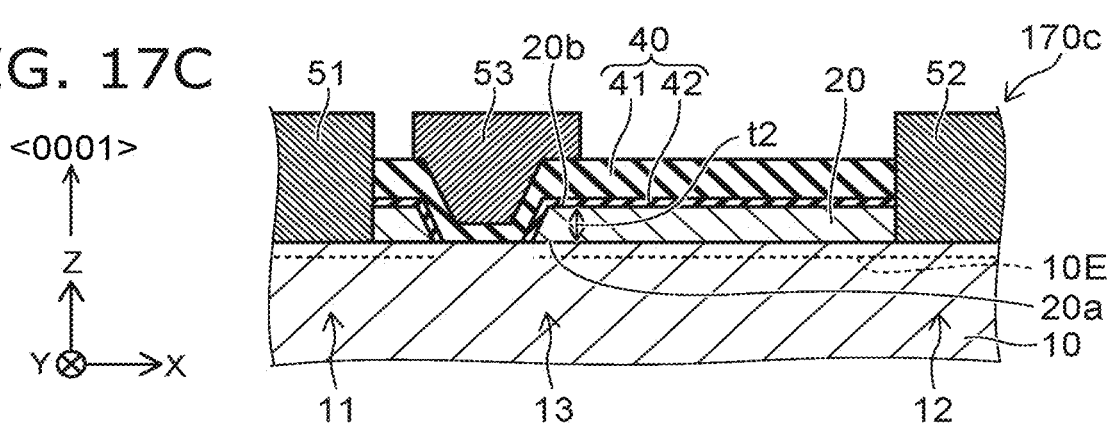
Figure 17D:
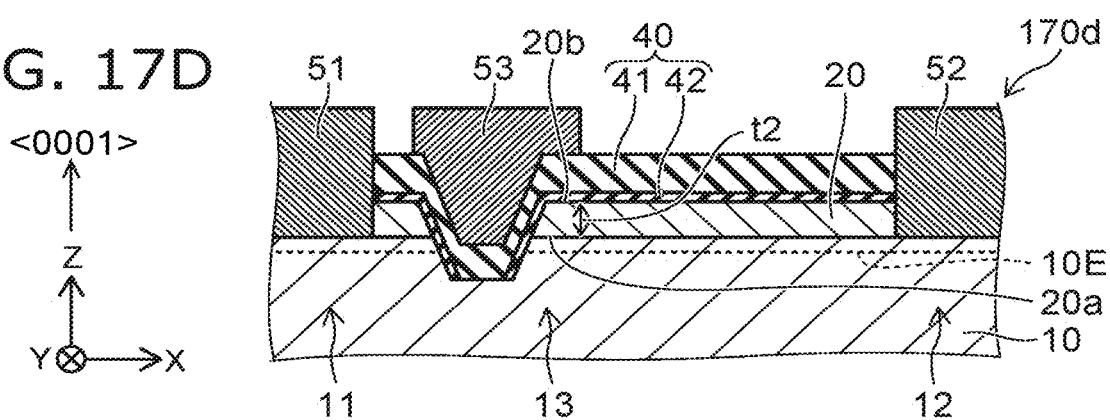
Figure 18A:
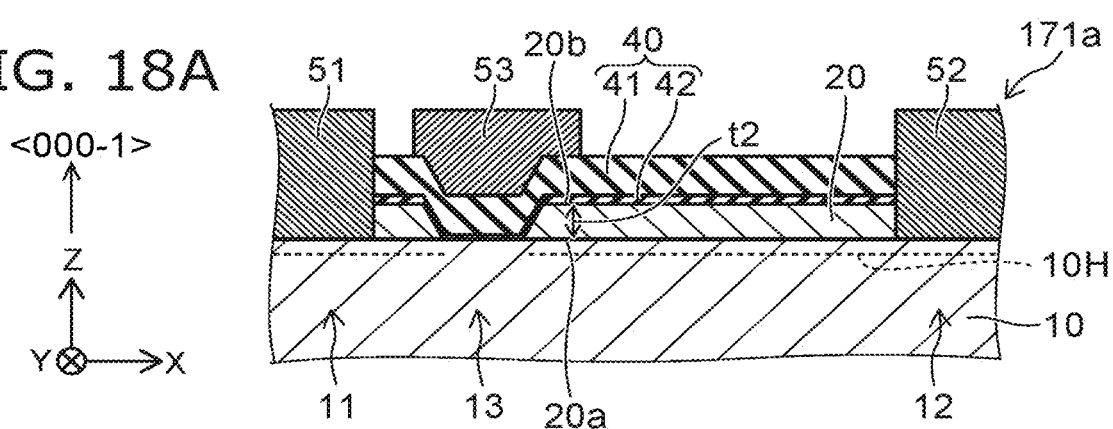
FIG. 18A to FIG. 18D are schematic cross-sectional views illustrating semiconductor devices according to an eighth embodiment.
Figure 18B:
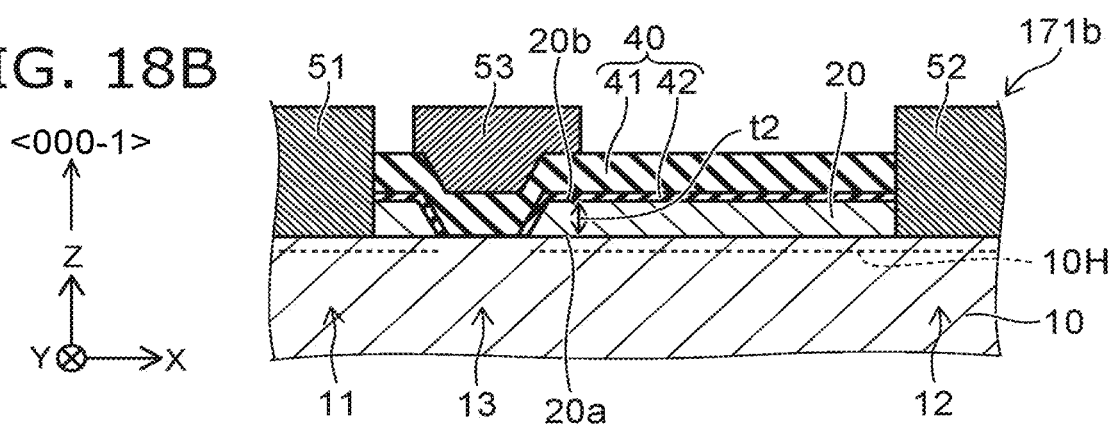
Figure 18C:
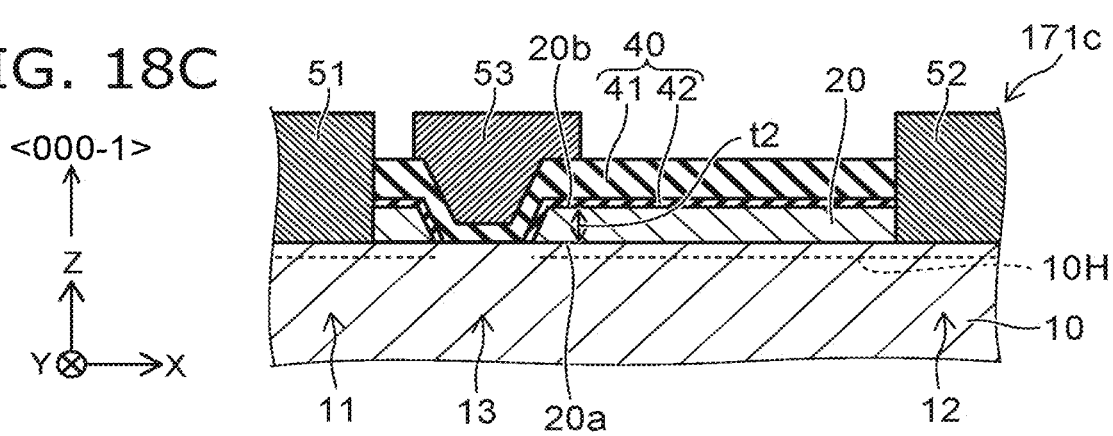
Figure 18D:
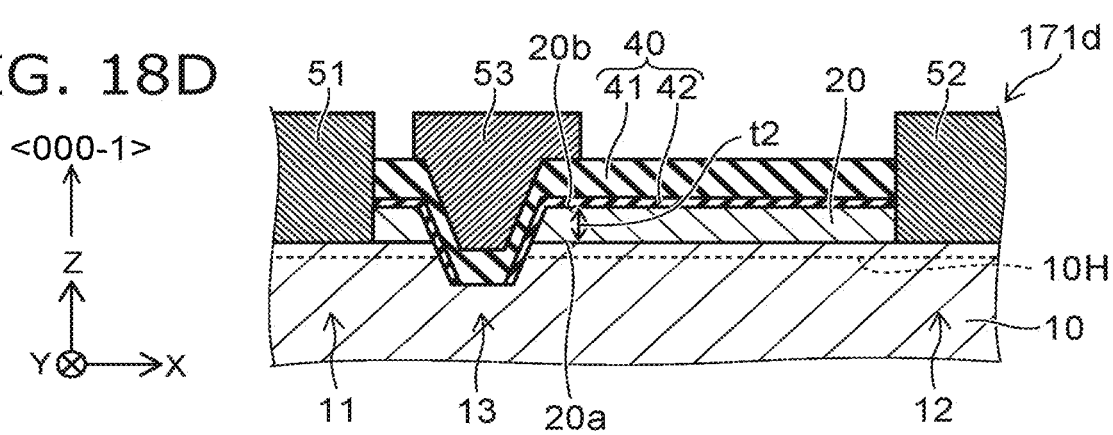

FIG. 16A and FIG. 16B are schematic cross-sectional views illustrating semiconductor devices according to the sixth embodiment.

As in a semiconductor device 161 shown in FIG. 16A, at least a portion of the first electrode 51 may overlap the first region 10 in the second direction (e.g., the X-axis direction). At least a portion of the second electrode 52 may overlap the first region 10 in the second direction.

As in a semiconductor device 162 shown in FIG. 16B, the fourth region 10d and the fifth region 10e may be provided. The impurity concentration in the fourth region 10d is higher than the impurity concentration in the first partial region 11. The impurity concentration in the fifth region 10e is higher than the impurity concentration in the second partial region 12. The impurity includes, for example, at least one selected from the group consisting of aluminum (Al) and boron (B). For example, the fourth region 10d and the fifth region 10e are obtained by implanting these elements as the impurity into the region used to form the first region 10. The fourth region 10d and the fifth region 10e may be provided in the semiconductor device 161 recited above.

In the fifth and sixth embodiments, the Al composition ratio x2 of the second region 20 is, for example, 0.5 or more. Thereby, for example, a high carrier concentration is obtained easily. The Al composition ratio x2 may be 0.8 or more. The Al composition ratio x2 may be 0.9 or more, and may be substantially 1.

Seventh Embodiment

FIG. 17A to FIG. 17D are schematic cross-sectional views illustrating semiconductor devices according to a seventh embodiment.

As shown in these figures, semiconductor devices 170a to 170d include the first region 10, the second region 20, the first to third electrodes 51 to 53, and the insulating portion 40. In the semiconductor devices 170a to 170d, the <0001> direction is aligned with the orientation from the first region 10 toward the second region 20. Other than the description recited below, the configurations of the semiconductor devices 170a to 170d may be similar to, for example, the configuration of the semiconductor device 150.

In the semiconductor devices 170a to 170d, a portion of the second region 20 is provided between the third electrode 53 and the first region 10 in the first direction (the Z-axis direction). Another portion of the second region 20 does not overlap the third electrode 53 in the first direction (the Z-axis direction). Other than the third region 30 not being provided, the configurations of the semiconductor devices 140a to 140d are applicable to the semiconductor devices 170a to 170d.

Eighth Embodiment

FIG. 18A to FIG. 18D are schematic cross-sectional views illustrating semiconductor devices according to an eighth embodiment.

As shown in these figures, semiconductor devices 171a to 171d also include the first region 10, the second region 20, the first to third electrodes 51 to 53, and the insulating portion 40. In the semiconductor devices 171a to 171d, the <000-1> direction is aligned with the orientation from the first region 10 toward the second region 20. Otherwise, the configurations of the semiconductor devices 171a to 171d are respectively similar to the configurations of the semiconductor devices 170a to 170d.

In the semiconductor devices 171a to 171d, for example, a carrier region (e.g., the two-dimensional hole gas 10H) that has a high carrier concentration is obtained.

Other than the third region 30 not being provided, the configurations of the semiconductor devices 141a to 141d are applicable to the semiconductor devices 171a to 171d.

In the first to eighth embodiments recited above, for example, the second region 20 is formed by at least one selected from the group consisting of MOCVD (metal organic chemical vapor deposition), molecular beam epitaxy (MBE), hydride vapor phase epitaxy (HVPE), sputtering, and pulsed laser deposition.

In the first to eighth embodiments recited above, the absolute value of the difference of the angle between the first direction (the Z-axis direction) and the <0001> direction of the second region 20 is, for example, 8 degrees or less; or the absolute value of the difference of the angle between the first direction (the Z-axis direction) and the <000-1> direction is, for example, 8 degrees or less. The <0001> direction or the <000-1> direction may be parallel to the first direction (the Z-axis direction). The <0001> direction or the <000-1> direction may be tilted at an angle of 8 degrees or less from the first direction. For example, the absolute value of the angle between the third surface 20a on the first region 10 side of the second region 20 (referring to FIG. 10, etc.) and the <0001> direction of the second region 20 is not less than 82 degrees and not more than 98 degrees; or the absolute value of the angle between the third surface 20a and the <000-1> direction of the second region 20 is not less than 82 degrees and not more than 98 degrees. Due to such angles, carriers based on the spontaneous polarization of the crystal of the second region 20 are generated efficiently in the first region 10.

According to the embodiments, a semiconductor device can be provided in which the characteristics can be improved.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first region including a first material including at least one selected from the group consisting of silicon carbide, silicon, carbon, and germanium, the first region including a first partial region, a second partial region, and a third partial region between the first partial region and the second partial region;
    a first electrode, a direction from the first partial region toward the first electrode being aligned with a first direction;
    a second electrode, a direction from the second partial region toward the second electrode being aligned with the first direction, a second direction from the first electrode toward the second electrode crossing the first direction;
    a third electrode, a direction from the third partial region toward the third electrode being aligned with the first direction, a position of the third electrode in the second direction being between a position of the first electrode in the second direction and a position of the second electrode in the second direction;
    a second region including $Al_{x2}Ga_{1-x2}N$ ($0<x2\leq1$), at least a portion of the second region being provided between the first electrode and the second electrode in the second direction; and
    a third region including a dielectric, at least a portion of the third region being provided between the first region and the second region.

2. The device according to claim 1, wherein a thickness along the first direction of the third region is thinner than a thickness along the first direction of the second region.

3. The device according to claim 1, wherein at least a portion of the second region is provided between the first region and at least a portion of the third electrode.

4. The device according to claim 1, further comprising an insulating portion,
    at least a portion of the second region being provided between the insulating portion and the first region in the first direction.

5. The device according to claim 4, wherein at least a portion of the insulating portion is provided between the third electrode and the second region in the first direction.

6. The device according to claim 5, wherein
    the insulating portion includes a first insulating layer and a second insulating layer,
    the second insulating layer is provided between the first insulating layer and the second region in the first direction,
    the first insulating layer includes oxygen,
    the second insulating layer includes nitrogen, and
    the second insulating layer does not include oxygen, or a concentration of oxygen in the second insulating layer is lower than a concentration of oxygen in the first insulating layer.

7. The device according to claim 6, wherein
    a portion of the first insulating layer is between the third partial region and the third electrode in the first direction, and
    the portion of the first insulating layer contacts the third partial region in the first direction.

8. The device according to claim 1, wherein a portion of the insulating portion overlaps the second region in the second direction.

9. The device according to claim 1, wherein a portion of the insulating portion overlaps the first region in the second direction.

10. The device according to claim 1, wherein at least a portion of the third electrode overlaps the second region in the second direction.

11. The device according to claim 1, wherein
    the first electrode is electrically connected to the first partial region,
    the second electrode is electrically connected to the second partial region.

12. The device according to claim 1, wherein
    at least a portion of the first electrode overlaps the first region in the second direction, and
    at least a portion of the second electrode overlaps the first region in the second direction.

13. The device according to claim 1, further comprising:
    a fourth region provided between the first partial region and the first electrode; and
    a fifth region provided between the second partial region and the second electrode,
    an impurity concentration in the fourth region being higher than an impurity concentration in the first partial region,
    an impurity concentration in the fifth region being higher than an impurity concentration in the second partial region.

14. The device according to claim 1, wherein x2 is 0.5 or more.

15. The device according to claim 1, wherein an absolute value of an angle between a first surface of the second region on the first region side and a <0001> direction of the second region is not less than 82 degrees and not more than 98 degrees, or an absolute value of an angle between the first surface and a <000-1> direction of the second region is not less than 82 degrees and not more than 98 degrees.

16. A semiconductor device, comprising:
    a first region including a first material including at least one selected from the group consisting of silicon carbide, silicon, carbon, and germanium, the first region including a first partial region, a second partial region, and a third partial region between the first partial region and the second partial region;
    a first electrode, a direction from the first partial region toward the first electrode being aligned with a first direction;
    a second electrode, a direction from the second partial region toward the second electrode being aligned with the first direction, a second direction from the first electrode toward the second electrode crossing the first direction;
    a third electrode, a direction from the third partial region toward the third electrode being aligned with the first direction, a position of the third electrode in the second direction being between a position of the first electrode in the second direction and a position of the second electrode in the second direction;
    a second region including $Al_{x2}Ga_{1-x2}N$ ($0<x2\leq1$), at least a portion of the second region being provided between the first electrode and the second electrode in the second direction; and
    a third region including at least one selected from the group consisting of silicon oxide, silicon oxynitride, silicon nitride, aluminum oxide, aluminum oxynitride, aluminum nitride, boron nitride, and hafnium oxide, at least a portion of the third region being provided between the first region and the second region.

17. A semiconductor device, comprising:

a first region including a first material including at least one selected from the group consisting of silicon carbide, silicon, carbon, and germanium, the first region including a first partial region, a second partial region, and a third partial region between the first partial region and the second partial region;

a first electrode, a direction from the first partial region toward the first electrode being aligned with a first direction;

a second electrode, a direction from the second partial region toward the second electrode being aligned with the first direction, a second direction from the first electrode toward the second electrode crossing the first direction;

a third electrode, a direction from the third partial region toward the third electrode being aligned with the first direction, a position of the third electrode in the second direction being between a position of the first electrode in the second direction and a position of the second electrode in the second direction; and a second region including $Al_{x2}Ga_{1-x2}N$ ($0<x2\leq1$), at least a portion of the second region being provided between the first electrode and the second electrode in the second direction, the first material having a first lattice constant in an axis direction crossing the first direction when unstrained, the $Al_{x2}Ga_{1-x2}N$ ($0<x2\leq1$) having a second lattice constant in the axis direction when unstrained, the second region having a second lattice length in the axis direction, a ratio of an absolute value of a difference between the first lattice constant and the second lattice length to an absolute value of a difference between the first lattice constant and the second lattice constant being 0.15 or more.

18. The device according to claim 17, wherein the ratio is 0.58 or more.

19. The device according to claim 17, wherein the ratio is 0.74 or more.

20. The device according to claim 17, wherein a thickness along the first direction of the second region is not less than 10 nm and not more than 500 nm.

* * * * *